(12) United States Patent
Saito

(10) Patent No.: US 8,535,994 B2
(45) Date of Patent: Sep. 17, 2013

(54) THIN-FILM TRANSISTOR ARRAY DEVICE MANUFACTURING METHOD

(75) Inventor: Toru Saito, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/476,460

(22) Filed: May 21, 2012

(65) Prior Publication Data
US 2012/0231589 A1 Sep. 13, 2012

Related U.S. Application Data

(63) Continuation of application No. PCT/JP2011/001358, filed on Mar. 8, 2011.

(51) Int. Cl.
*H01L 21/00* (2006.01)
(52) U.S. Cl.
USPC .................. 438/150; 438/149; 257/E21.001
(58) Field of Classification Search
USPC .................................................. 438/149–166
See application file for complete search history.

(56) References Cited

U.S. PATENT DOCUMENTS

| | | | | |
|---|---|---|---|---|
| 5,618,741 | A * | 4/1997 | Young et al. | 438/151 |
| 5,818,070 | A * | 10/1998 | Yamazaki et al. | 257/72 |
| 6,437,284 | B1 * | 8/2002 | Okamoto et al. | 219/121.73 |
| 6,448,533 | B1 * | 9/2002 | Kanayama | 219/121.64 |
| 6,566,683 | B1 * | 5/2003 | Ogawa et al. | 257/53 |
| 6,593,661 | B2 * | 7/2003 | Kanayama | 257/774 |
| 6,635,932 | B2 * | 10/2003 | Grigoropoulos et al. | 257/359 |
| 7,102,750 | B2 * | 9/2006 | Takami | 356/432 |
| 7,113,527 | B2 * | 9/2006 | Tanaka | 372/24 |
| 7,145,175 | B2 * | 12/2006 | Kato et al. | 257/59 |
| 7,384,810 | B2 | 6/2008 | Tai et al. | |
| 7,405,464 | B2 | 7/2008 | Joo et al. | |
| 7,433,372 | B2 * | 10/2008 | Hofmann | 372/9 |
| 7,538,948 | B2 * | 5/2009 | Muenz et al. | 359/618 |

(Continued)

FOREIGN PATENT DOCUMENTS

| | | |
|---|---|---|
| JP | 2002-231955 | 8/2002 |
| JP | 2006-295117 | 10/2006 |

(Continued)

OTHER PUBLICATIONS

U.S. Appl. No. 13/451,078 to Tomohiko Oda et al., which was filed on Apr. 19, 2012.

(Continued)

*Primary Examiner* — Seahvosh Nikmanesh
*Assistant Examiner* — Evren Seven
(74) *Attorney, Agent, or Firm* — Greenblum & Bernstein, P.L.C.

(57) ABSTRACT

The following processes are included: preparing a substrate; forming a first gate electrode above the substrate; forming a second gate electrode above the substrate and adjacent to the first gate electrode; forming a gate insulating film on the first gate electrode and the second gate electrode; forming, on the gate insulating film, a noncrystalline semiconductor film at least in a first region above the first gate electrode and a second region above the second gate electrode; irradiating the noncrystalline semiconductor film a laser beam having continuous convex light intensity distributions; and forming a first source electrode and a first drain electrode above the first region, and a second source electrode and a second drain electrode above the second region. In the irradiating, when irradiating the first region with an inner region of the laser beam, the second region is irradiated with an outer region of the laser beam.

20 Claims, 21 Drawing Sheets

(56) References Cited

U.S. PATENT DOCUMENTS

| | | | |
|---|---|---|---|
| 7,557,050 B2 | 7/2009 | Chung et al. | |
| 7,598,565 B2* | 10/2009 | Kato | 257/316 |
| 7,704,812 B2* | 4/2010 | Kato et al. | 438/166 |
| 7,709,309 B2* | 5/2010 | Moriwaka | 438/166 |
| 7,723,135 B2* | 5/2010 | Yazaki et al. | 438/30 |
| 7,790,521 B2* | 9/2010 | Asano | 438/149 |
| 7,811,910 B2* | 10/2010 | Hongo et al. | 438/487 |
| 7,864,429 B2* | 1/2011 | Muenz et al. | 359/626 |
| 8,058,709 B2* | 11/2011 | Moriwaka | 257/628 |
| 8,119,546 B2 | 2/2012 | Joo et al. | |
| 8,170,072 B2* | 5/2012 | Kawaguchi et al. | 372/9 |
| 8,221,544 B2* | 7/2012 | Im et al. | 117/9 |
| 8,421,080 B2* | 4/2013 | Saitoh et al. | 257/59 |
| 2006/0141683 A1* | 6/2006 | Inoue et al. | 438/149 |
| 2006/0228908 A1 | 10/2006 | Chung et al. | |
| 2006/0267011 A1 | 11/2006 | Tai et al. | |
| 2007/0026549 A1 | 2/2007 | Joo et al. | |
| 2007/0178674 A1* | 8/2007 | Imai et al. | 438/487 |
| 2007/0188089 A1 | 8/2007 | Choi et al. | |
| 2008/0090396 A1* | 4/2008 | Ohnuma | 438/585 |
| 2008/0206912 A1 | 8/2008 | Joo et al. | |
| 2008/0290344 A1 | 11/2008 | Tai et al. | |
| 2009/0275178 A1 | 11/2009 | Chung et al. | |
| 2011/0006297 A1* | 1/2011 | Inoue et al. | 257/43 |
| 2011/0049511 A1* | 3/2011 | Yano et al. | 257/43 |
| 2011/0170084 A1* | 7/2011 | Ohnuma et al. | 355/71 |
| 2011/0297950 A1 | 12/2011 | Kato et al. | |
| 2011/0318891 A1 | 12/2011 | Oda et al. | |
| 2012/0032179 A1* | 2/2012 | Saitoh et al. | 257/59 |
| 2012/0064701 A1 | 3/2012 | Saito et al. | |

FOREIGN PATENT DOCUMENTS

| | | |
|---|---|---|
| JP | 2006-332323 | 12/2006 |
| JP | 2007-043157 | 2/2007 |
| JP | 2007-219517 | 8/2007 |
| JP | 2009-246235 | 10/2009 |
| JP | 2009-277478 | 11/2009 |
| JP | 2010-140934 | 6/2010 |

OTHER PUBLICATIONS

International Search Report in PCT/JP2011/001358, dated Jun. 28, 2011.

* cited by examiner

THIN-FILM TRANSISTOR ARRAY DEVICE MANUFACTURING METHOD

CROSS REFERENCE TO RELATED APPLICATION

This is a continuation application of PCT Patent Application No. PCT/JP2011/001358 filed on Mar. 8, 2011, designating the United States of America. The entire disclosure of the above-identified application, including the specification, drawings and claims is incorporated herein by reference in its entirety.

TECHNICAL FIELD

The present disclosure relates to a thin-film transistor array device, an organic EL display device, and a thin-film transistor array device manufacturing method.

BACKGROUND ART

In an active-matrix display device such as a liquid crystal display device or an organic electroluminescence (EL) display device, thin-film transistors, which are also known as the TFTs are used.

In such a display device, thin-film transistors are arranged in an array to constitute a thin-film transistor array device. In each pixel, a driver transistor for driving the pixel and a switching transistor for selecting the pixel are formed.

In particular, in a light-emitting organic EL display device having organic EL elements, different capacity is required for the driving transistor and the switching transistor. More specifically, satisfactory turn-on characteristics are required for the driving transistor in order to improve the driving capacity of the organic EL element, while satisfactory turn-off characteristics are required for the switching transistor.

As an example of such a technique, the patent literature 1 discloses an organic EL display device in which two types of thin film transistors having different characteristics are provided in one pixel. In the patent literature 1, two types of transistors having different characteristics are formed in one pixel by having different crystalline property in the channel layers for the driving transistor and the switching transistor.

CITATION LIST

Patent Literature

[Patent Literature 1] Japanese Unexamined Patent Application Publication No. 2007-219517

SUMMARY OF INVENTION

Technical Problem

However, in the patent literature 1, after a crystallized semiconductor film (channel layer) and source-drain electrodes are formed as the driving transistor on the gate insulating film, the semiconductor layer (channel layer) and the source-drain electrodes and others are formed as the switching transistor. More specifically, after the driving transistor is completed, the switching transistor is manufactured by separately forming the channel layer, and the source-drain electrodes, and others.

In the patent literature 1, the driving transistor and the switching transistor are manufactured by separate processes as described above. Consequently, there is a problem that the number of processes for manufacturing the thin film transistors significantly increases, increasing the cost and the takt time.

One non-limiting and exemplary embodiment has been conceived in view of the problem, and provides a thin-film transistor array device, including thin-film transistors having different capacity without increasing the number of processes, an organic EL display device, and a thin-film transistor array device manufacturing method. Additional benefits and advantages of the disclosed embodiments will be apparent from the specification and Figures. The benefits and/or advantages may be individually provided by various embodiments and features of the specification and drawings disclosure, and need not all be provided in order to obtain one of more of the same.

Solution to Problem

In one general aspect, the techniques disclosed here feature an aspect of a thin-film transistor array device manufacturing method including: preparing a substrate; forming a first gate electrode above the substrate; forming a second gate electrode above the substrate and adjacent to the first gate electrode; forming a gate insulating film on the first gate electrode and the second gate electrode; forming, on the gate insulating film, a noncrystalline semiconductor film at least in a first region above the first gate electrode and a second region above the second gate electrode; irradiating the noncrystalline semiconductor film formed in the first region and the second region with a laser beam having continuous convex light intensity distributions in both a short-axis direction and a long-axis direction; and forming a first source electrode and a first drain electrode above the first region, and a second source electrode and a second drain electrode above the second region, in which, in the irradiating, when irradiating the first region of the noncrystalline semiconductor film with an inner region of the laser beam, the second region is irradiated with an outer region of the laser beam which is a region outside of the inner region, continuous from the inner region, and with a light intensity lower than the light intensity of the inner region.

Advantageous Effects of Invention

According to the thin-film transistor array device manufacturing method according to the present disclosure, a semiconductor film having different crystalline structures is formed in the same process by irradiating the noncrystalline semiconductor film with a continuous wave laser having a desired continuous light intensity distribution. With this, it is possible to form two different thin-film transistors having different transistor characteristics desirably without increasing the number of processes. For example, in each pixel of the display device, the driving transistor which requires satisfactory turn-on characteristics and the switching transistor which requires satisfactory turn-off characteristics are collectively formed.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings.

DETAILED DESCRIPTION

Figure 1:
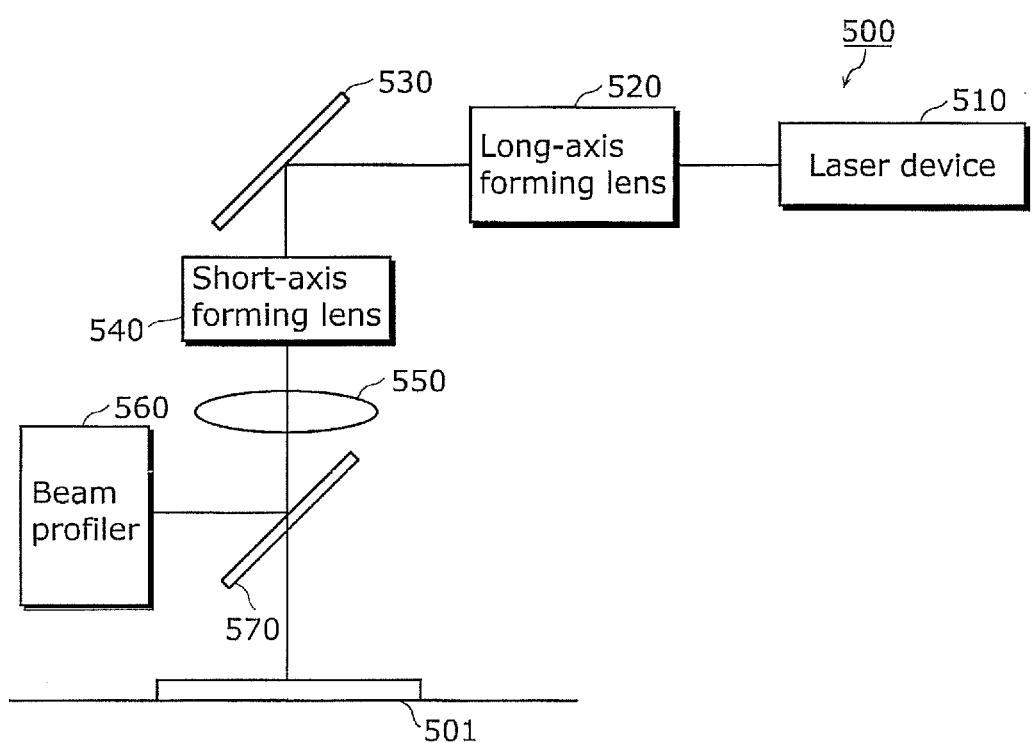
FIG. 1 is a diagram showing an example configuration of a CW laser beam crystallization device in an embodiment of the present disclosure.

An aspect of a thin-film transistor array device manufacturing method according to the present disclosure includes: preparing a substrate; forming a first gate electrode above the substrate; forming a second gate electrode above the substrate and adjacent to the first gate electrode; forming a gate insulating film on the first gate electrode and the second gate electrode; forming, on the gate insulating film, a noncrystalline semiconductor film at least in a first region above the first gate electrode and a second region above the second gate electrode; irradiating the noncrystalline semiconductor film formed in the first region and the second region with a laser beam having continuous convex light intensity distributions in both a short-axis direction and a long-axis direction; and forming a first source electrode and a first drain electrode above the first region, and a second source electrode and a second drain electrode above the second region, in which, in the irradiating, when irradiating the first region of the noncrystalline semiconductor film with an inner region of the laser beam, the second region is irradiated with an outer region of the laser beam which is a region outside of the inner region, continuous from the inner region, and with a light intensity lower than the light intensity of the inner region.

In an aspect of the thin-film transistor array device manufacturing method according to the present disclosure, when irradiating the noncrystalline semiconductor film with the laser beam, the first region is irradiated with the inner region of the laser beam such that the noncrystalline semiconductor film in the first region is heated to a temperature equal to or above a melting point of a crystalline semiconductor film obtained by crystallizing the noncrystalline semiconductor film, and the second region is irradiated with the outer region of the laser beam such that the noncrystalline semiconductor film in the second region is heated to a temperature below the melting point of the crystalline semiconductor film, for example.

In an aspect of the thin-film transistor array device manufacturing method according to the present disclosure, when irradiating the noncrystalline semiconductor film with the laser beam, the second region is irradiated with the outer region of the laser beam such that the noncrystalline semiconductor film in the second region is heated to a temperature equal to or above the melting point of the noncrystalline semiconductor film, for example.

In an aspect of the thin-film transistor array device manufacturing method according to the present disclosure, when irradiating the noncrystalline semiconductor film with the laser beam, the second region is irradiated with the outer region of the laser beam such that the noncrystalline semiconductor film in the second region is heated to a temperature below a melting point of the noncrystalline semiconductor film and equal to or above a crystal growth temperature of the noncrystalline semiconductor film, for example.

In an aspect of the thin-film transistor array device manufacturing method according to the present disclosure, when irradiating the noncrystalline semiconductor film with the laser beam, the second region is irradiated with the outer region of the laser beam such that the noncrystalline semiconductor film in the second region is heated to a temperature equal to or below a crystal growth temperature of the noncrystalline semiconductor film, for example.

In an aspect of the thin-film transistor array device manufacturing method according to the present disclosure, the irradiating includes crystallizing the noncrystalline semiconductor film by cooling the noncrystalline semiconductor film in the first region after heating the noncrystalline semiconductor film, for example.

In an aspect of the thin-film transistor array device manufacturing method according to the present disclosure, when irradiating the noncrystalline semiconductor film with the laser beam, the noncrystalline semiconductor film formed in the first region is crystallized into a first crystalline semiconductor film having crystal grains of a first average crystal grain size, and the noncrystalline semiconductor film formed in the second region is crystallized into a second crystalline semiconductor film having crystal grains of a second average crystal grain size smaller than the first average crystal grain size, for example.

In an aspect of the thin-film transistor array device manufacturing method according to the present disclosure, when maximum light intensity in at least one of the light intensity distributions of the laser beam is 100%, the inner region is a region of light intensity from 77% to 100%, for example.

In an aspect of the thin-film transistor array device manufacturing method according to the present disclosure, the first average crystal grain size is from 60 nm to 1 μm, for example.

In an aspect of the thin-film transistor array device manufacturing method according to the present disclosure, when maximum light intensity in at least one of the light intensity distributions of the laser beam is 100%, the outer region is a region of light intensity from 61% to 77%, for example.

In an aspect of the thin-film transistor array device manufacturing method according to the present disclosure, when irradiating the noncrystalline semiconductor film with the laser beam, the noncrystalline semiconductor film formed in the second region is crystallized into a second crystalline semiconductor film having an average crystal grain size from 40 nm to 60 nm, for example.

In an aspect of the thin-film transistor array device manufacturing method according to the present disclosure, when irradiating the noncrystalline semiconductor film with the laser beam, the second region is irradiated with the outer region of the laser beam such that the noncrystalline semiconductor film in the second region is heated to a temperature equal to or above 1100° C. and below 1414° C., and the noncrystalline semiconductor film in the second region is crystallized after a supercooled liquid state, for example.

In an aspect of the thin-film transistor array device manufacturing method according to the present disclosure, when maximum light intensity in at least one of the light intensity distributions of the laser beam is 100%, the outer region is a region of light intensity from 44% to 61%, for example.

In an aspect of the thin-film transistor array device manufacturing method according to the present disclosure, when irradiating the noncrystalline semiconductor film with the laser beam, the noncrystalline semiconductor film formed in the second region is crystallized into a second crystalline semiconductor film having an average crystal grain size from 25 nm to 35 nm, for example.

In an aspect of the thin-film transistor array device manufacturing method according to the present disclosure, when irradiating the noncrystalline semiconductor film with the laser beam, the second region is irradiated with the outer region of the laser beam such that the temperature of the noncrystalline semiconductor film is equal to or above 600° C. and below 1100° C., and crystals grow by solid-phase growth in the noncrystalline semiconductor film in the second region, for example.

In an aspect of the thin-film transistor array device manufacturing method according to the present disclosure, the first crystalline semiconductor film and the second crystalline semiconductor film are spaced apart, for example.

In an aspect of the thin-film transistor array device manufacturing method according to the present disclosure, a boundary portion between the first crystalline semiconductor film and the second crystalline semiconductor film is removed by patterning, for example.

In an aspect of the thin-film transistor array device manufacturing method according to the present disclosure, the continuous convex light intensity distributions are Gaussian distributions, for example.

In an aspect of the thin-film transistor array device manufacturing method according to the present disclosure, the laser irradiation is performed on the noncrystalline semiconductor film in an order of microseconds, for example.

Embodiment

The following shall describe a thin-film transistor array device, an organic EL display device, and a thin-film transistor manufacturing method according to the present disclosure with reference to the drawings. Note that, the following embodiment described below illustrates one exemplary embodiment of the present disclosure. Note that the numbers, shape, material, components, arrangement positions and the connection of the components, steps, and the order of steps are merely examples, and are not intended to limit the present disclosure. The present disclosure is determined only by Claims. Accordingly, among the components in the embodiment, the components that are not recited in an independent claim indicating the most generic idea of the present disclosure are not always necessary for solving the problem of the present disclosure. However, these components shall be described as a part of a more desirable embodiment. Note that, the drawings are schematic diagrams for illustration, and the thicknesses and a ratio of the components are not necessarily strictly accurate.

(CW Laser Beam Crystallization Device)

First, a CW laser beam crystallization device 500 which is used for manufacturing a thin-film transistor array device according to an embodiment of the present disclosure shall be described with reference to the drawings.

Figure 2A:
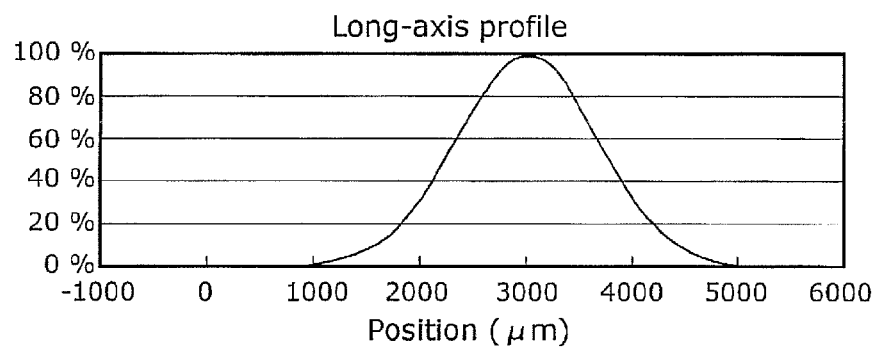
FIG. 2A is a diagram showing a long-axis profile of the CW laser beam in the embodiment of the present disclosure.
Figure 2B:
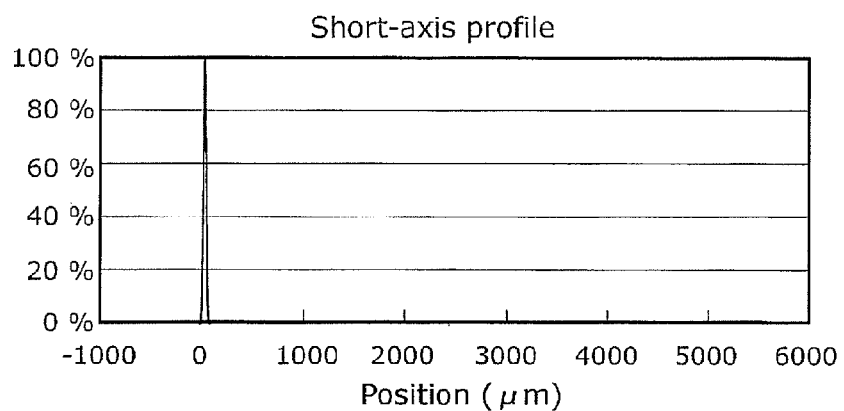
FIG. 2B is a diagram showing a short-axis profile of the CW laser beam in the embodiment of the present disclosure.
Figure 2C:
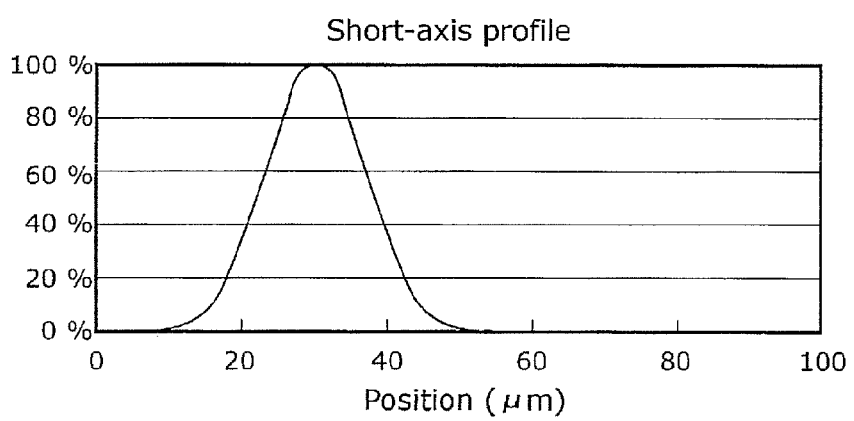
FIG. 2C is a short-axis profile of the CW laser beam in the embodiment of the present disclosure (enlarged view of FIG. 2B).

FIG. 1 is a diagram showing an example configuration of a CW laser crystallization device according to the embodiment. FIG. 2A is a diagram showing a long-axis profile of the CW laser beam in the embodiment. FIGS. 2B and 2C are diagrams each showing a short-axis profile of the CW laser beam in the embodiment, and FIG. 2C is a view (enlarged view) with a position range reduced in size from FIG. 2B.

As shown in FIG. 1, the CW laser beam crystallization device 500 in the embodiment is a device which irradiates a sample 501 in which a noncrystalline semiconductor film such as an amorphous silicon film is formed on a glass substrate, with a continuous wave (CW) laser beam in the order of microseconds. The CW laser beam crystallization device 500 includes: a laser device 510, a long-axis forming lens 520, a mirror 530, a short-axis forming lens 540, a collection lens 550, a beam profiler 560, and silica glass 570.

The laser device 510 oscillates a CW laser beam that is a continuous wave laser beam. In the embodiment, the laser device 510 irradiates the substrate with, for example, a green laser beam or a blue laser beam for a relatively long time, that is, 10 to 100 microseconds, instead of irradiation for a period of time as short as 10 to 100 nanoseconds.

In the CW laser beam crystallization device 500, the CW laser beam oscillated by the laser device 510 passes through the long-axis forming lens 520, to have the irradiation direction changed by the mirror 530. The CW laser beam, having the irradiation direction changed by the mirror 530, passes through the short-axis forming lens 540, and is collected by the collection lens 550 to be projected onto the sample 501. In addition, a most part of the CW laser beam collected by the collection lens 550 passes through the silica glass 570 to be projected onto the sample 501, but another part of the CW laser beam collected by the collection lens 550 enters the beam profiler 506, which measures a beam profile.

Here, as shown in FIGS. 2A to 2C, the beam profile of the CW laser beam collected by the collection lens 550, that is, the beam profile of the CW laser beam projected onto the sample 501 by the CW laser beam crystallization device 500, has a convex-shaped light intensity distribution which is a Gaussian distribution in both long and short axes. However, as shown in FIGS. 2A and 2B, a light intensity distribution in the long-axis indicates a wider Gaussian distribution than in the short-axis, at a range of positions from 0 μm to 6000 μm. In addition, as shown in FIGS. 2B and 2C, the light intensity distribution in the short-axis indicates a Gaussian distribution at a narrow range of positions from 0 μm to 60 μm. It is to be noted that in FIGS. 2A to 2C, the vertical axis represents relative intensity when assuming that the laser beam intensity as 100% is at a point which indicates the maximum laser beam intensity in the CW laser beam profile.

Thus, in the embodiment, the beam profile of the CW laser beam collected by the collection lens 550 has a convex-shaped Gaussian light intensity distribution in both long and short axes. This light intensity distribution is formed when the CW laser beam oscillated by the laser device 510 passes though the short-axis forming lens 540 and the long-axis forming lens 520. In addition, based on the beam profile measured by the beam profiler 560, it is possible to adjust the long-axis forming lens 520 and the short-axis forming lens 540 such that the beam profile of the CW laser beam represents a Gaussian distribution in both long and short axes.

Note that the beam profile of the CW laser beam collected by the collection lens 550 and projected onto the sample 501 typically has a Gaussian light intensity distribution, but this is not the only case. For the CW laser beam to be projected onto the sample 501, the beam only needs to indicate a bell-shaped continuous light intensity distribution that is convex upward.

Here, the following shall describe the reason for considering, as typical, the case where the beam profile of the CW laser beam, collected by the collection lens 550, has a Gaussian light intensity distribution in both long and short axes. The light intensity distribution of the CW laser beam oscillated by a CW laser beam oscillation device originally is the Gaussian distribution or an equivalent to the Gaussian distribution. Since it is not necessary to introduce a special additional device or part into an optical system of the CW laser beam crystallization device 500, it is possible to perform, relatively easily, irradiation of the CW laser beam having a beam profile which represents the Gaussian light intensity distribution in both long and short axes.

(Crystalline Structure of Noncrystalline Semiconductor Film)

By irradiating the noncrystalline semiconductor film with the CW laser beam, using the CW laser beam crystallization device 500, a crystalline semiconductor film having different crystalline structures can be obtained.

For example, depending on the beam profile of the CW laser beam, a silicon thin-film having crystalline structure crystallized in the SPC range, the Ex range, or the melting range is obtained by irradiating an amorphous silicon thin film as the noncrystalline semiconductor film with the CW laser beam so as to anneal the amorphous silicon thin film.

A solid phase crystallization (SPC) range is a temperature range in which the noncrystalline semiconductor film becomes crystallized within a range equal to or below a melting point of amorphous silicon, that is, a temperature range of 600° C. to 1100° C. In other words, SPC is a phenomenon in which crystallization occurs by solid-phase growth at a temperature range equal to or below the melting point of amorphous silicon, that is, the temperature range of 600° C. to 1100° C. The silicon crystalline structure generated by SPC has, for example, an average grain size of approximately 25 nm to 35 nm.

An explosive nucleation (Ex) range is a temperature range in which the noncrystalline semiconductor film becomes crystallized within a range that is equal to or above the melting point of amorphous silicon and is equal to or below the melting point of silicon, that is, a temperature range of 1100° C. to 1414° C. In other words, Ex is a phenomenon in which crystallization occurs, after a supercooled liquid state, at a temperature range that is equal to or above the melting point of amorphous silicon and is equal to or below the melting point of silicon, that is, the temperature range of 1100° C. to 1414° C. The silicon crystalline structure generated by Ex has, for example, an average grain size of approximately 40 nm to 60 nm.

A melting range is above or equal to the melting point of silicon, that is, the temperature range of 1414° C. or above. Note that crystallizing the amorphous silicon according to the melting range results in p-Si (polycrystalline silicon) having an average grain size of approximately 60 nm to 1 μm.

Figure 3:
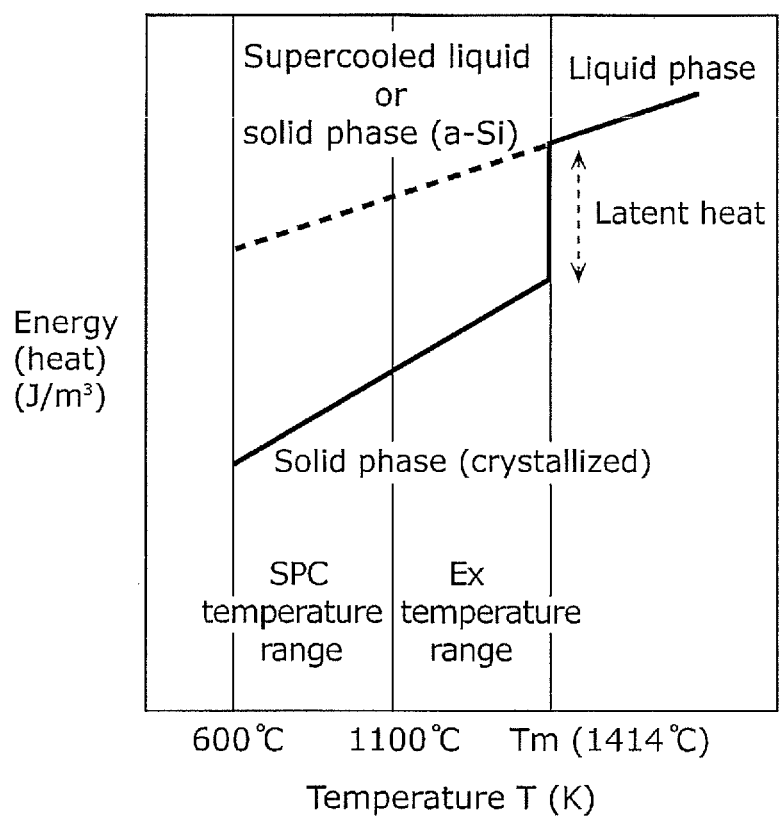
FIG. 3 is a diagram showing a relationship between temperature and energy for crystallizing silicon.

Here, the mechanism for crystallizing silicon is described with reference to FIG. 3. FIG. 3 is a diagram showing a relationship between temperature and energy for crystallizing silicon. Note that in FIG. 3, the horizontal axis represents temperature, and the vertical axis represents energy (heat).

As shown in FIG. 3, silicon in the amorphous state is heated by, for example, irradiation of a laser beam or the like, and is assumed to fall within the SPC range, that is, the temperature range of 600° C. to 1100° C. This causes a solid-phase growth of amorphous silicon into microcrystal. Note that the silicon crystallized within this SPC range becomes SPC crystalline silicon having an average grain size of 25 nm to 35 nm.

Furthermore, it is assumed that: by heating the silicon of the SPC range, the temperature within the silicon is within the Ex range, which is a range above 1100° C. that is the temperature considered as the melting point that causes change in atomic network structure in the silicon in the amorphous state, and is also a range equal to or below 1414° C. that is the melting point of silicon. In this case, the grain size of silicon crystals slightly increases from the size of crystals (crystalline silicon of SPC) obtained in solid-phase growth. A possible reason for this is that: the temperature of the silicon has increased to a level equal to or above the melting point of the amorphous silicon, to thereby melt the silicon partially and increase the grain size. Note that the silicon crystallized within this Ex range becomes a crystalline silicon of the Ex range having an average grain size of 40 nm to 60 nm.

Then, furthermore, it is assumed that the silicon of the Ex range is heated to have a temperature within the melting range, that is, the temperature range equal to or above 1414° C. that is the melting point of silicon. Thus, the crystals obtained within the Ex range (crystalline silicon of Ex) is provided with thermal energy as latent heat at the melting point of the silicon, and is solved (into a liquid phase). Note that the silicon, which becomes crystallized through the melting range, becomes crystallized involving volume expansion after it is solved and reduced in volume, and is formed into a p-Si (polycrystalline silicon) having an average grain size of 60 nm or above.

Figure 4:
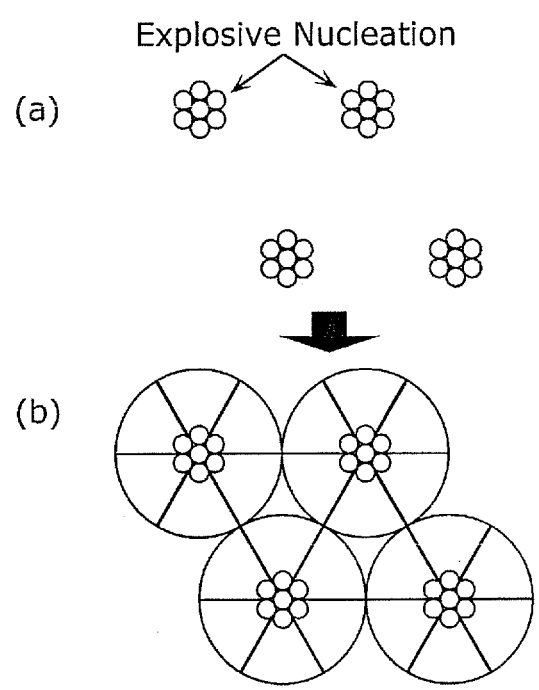
FIG. 4 is a diagram for describing a growth mechanism of an Ex crystalline structure.

Next, the mechanism for melting the silicon of the Ex range will be described with reference to FIG. 4. FIG. 4 is a diagram for describing a growth mechanism of the Ex crystalline structure.

In the silicon within the SPC range, atoms stochastically gather, become a crystal nucleus when having a size over a critical grain size (up to 1 nm), and grow into crystals.

In contrast, since the silicon in the Ex range is heated to a temperature equal to or above the melting point of amorphous silicon, movement of atoms is promoted, which promotes, as shown in FIG. 4 (a), crystal nucleation. Then, as shown in FIG. 4 (b), a periphery of the nucleus after explosive nucleation is melted by latent heat, and then crystallized.

As described above, the mechanism of crystallization differs among the case of crystallization within the SPC range, the case of crystallization beyond the SPC range and within the Ex range and the case of crystallization within the melting range, and the difference causes difference in grain size after the crystallization accordingly.

(Relationship Between Crystalline Structure of Noncrystalline Semiconductor Film and CW Laser Beam)

After diligent consideration on the relationship between the energy density of the CW laser beam and the crystalline structure of silicon, inventors of the present application found out that the crystalline structure with different grain sizes can be formed depending on the output energy density of the CW laser beam. The following is specific description.

Figure 5A:
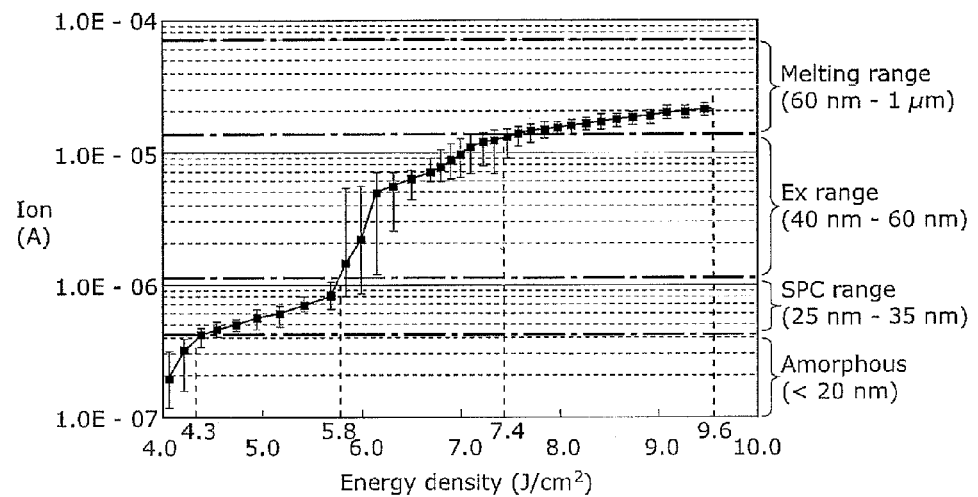
FIG. 5A shows a relationship between the energy density of CW laser beam and the turn-on current of the TFT (or crystalline structure of silicon).
Figure 5B:
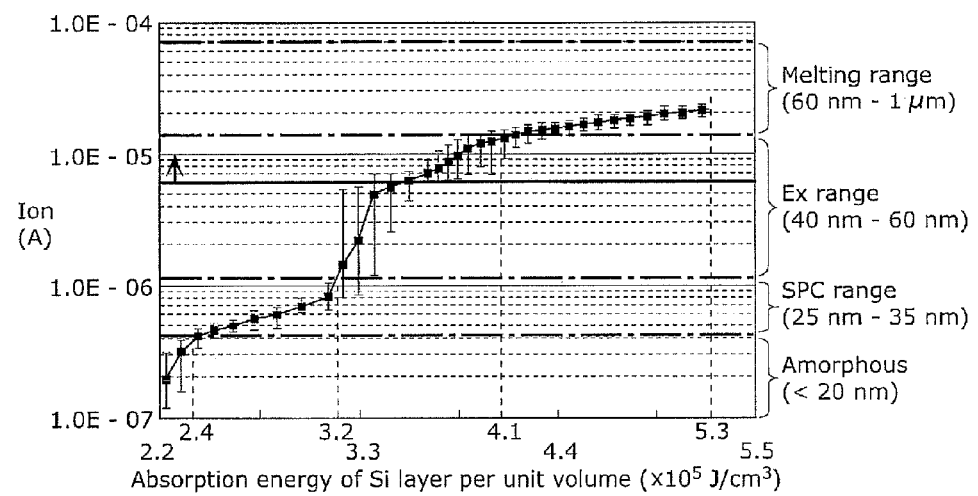
FIG. 5B shows a relationship between the absorption energy of silicon per unit volume and the turn-on current (or crystalline structure of silicon).

The inventors formed a crystalline semiconductor film by crystallizing a noncrystalline semiconductor film using the CW laser beam, and manufactured a TFT having the crystalline semiconductor film as a channel layer, and examined the change in the turn-on current (Ion) of the TFT with respect to the energy density of the CW laser beam. The results are the curves indicating the relationships shown in FIGS. 5A and 5B. FIG. 5A shows the relationship between the energy density of the CW laser beam and the turn-on current of the TFT (or crystalline structure of silicon). FIG. 5B illustrates the relationship between the absorption energy of silicon per unit volume and the turn-on current (or crystalline structure of silicon). Note that, in this experiment, an amorphous silicon film is used as the noncrystalline semiconductor film.

As illustrated in FIG. 5A, when the energy density of the CW laser beam is changed, the turn-on current of the TFT increases as the energy density increases. More specifically, the grain size in the crystalline structure of silicon increases as the energy density increases. As a result, carrier mobility increases. Furthermore, in the curve in FIG. 5A, there are singularities. Each of the singularities indicates a boundary of the crystalline structure in silicon, that is, a boundary between amorphous, the SPC range, the Ex range, and the melting range.

Subsequently, as the output energy density of the CW laser beam increases, the crystalline structure of silicon changes from amorphous, the SPC range, the Ex range, to the melting range in order.

More specifically, when the energy density of the CW laser beam is less than 4.3 [J/cm$^2$], the amorphous silicon film irradiated with the CW laser has an amorphous crystalline structure having an average grain size smaller than 25 nm. More specifically, the amorphous silicon film irradiated with the laser is heated in a temperature range below or equal to a crystal growing temperature of amorphous silicon (600° C.).

When the energy density of the CW laser beam is greater than or equal to 4.3 [J/cm²] and smaller than 5.8 [J/cm²], the amorphous silicon film is crystallized in the SPC range, and a crystalline silicon film having an average grain size of greater than or equal to 25 nm and smaller than 35 nm is obtained. More specifically, the amorphous silicon film irradiated with laser is heated in a temperature range (600° C. to 1100° C.) which is higher than or equal to the crystal growing temperature of the amorphous silicon and below or equal to the melting point of the amorphous silicon, and is crystallized by the solid-phase growth of crystals in the amorphous silicon film.

When the energy density of the CW laser beam is greater than or equal to 5.8 [J/cm²] and smaller than 7.4 [J/cm²], the amorphous silicon film is crystallized in the Ex range, and a crystalline silicon film having an average grain size of greater than or equal to 40 nm and smaller than 60 nm is obtained. In other words, the amorphous silicon film irradiated with the laser is heated at a temperature range (1100° C. to 1414° C.) that is equal to or above the melting point of amorphous silicon and is equal to or below the melting point of silicon, and is crystallized after the supercooled state.

When the energy density of the CW laser beam is greater than or equal to 7.4 [J/cm²] and smaller than 9.6 [J/cm²], the amorphous silicon film is crystallized in the melting range, and a crystalline silicon film having an average grain size greater than or equal to 60 nm and smaller than 1 μm is obtained. More specifically, the amorphous silicon film irradiated with laser is heated in a temperature range equal to or above the melting point of silicon (1414° C.) and melt-crystallized.

Note that, when the amorphous silicon film is irradiated with the laser having an energy density of the CW laser beam greater than or equal to 9.6 [J/cm²], the silicon film is in ablation state, and does not function as a channel layer of the TFT. Accordingly, in the embodiment, the maximum value of the energy density is 9.6 [J/cm²].

FIG. 5B is a diagram showing FIG. 5A converted to a general formula for silicon, and the energy density (the horizontal axis) in FIG. 5A is represented as an absorption energy of silicon per unit volume. The following shall describe the conversion.

First, if the laser irradiation power density is P[kW/cm²], the laser scanning speed is ss[mm/s], and the short-axis width of the beam profile of the laser beam is S[μm], the energy density Eirr[J/cm²] is represented as Eirr=P×S/ss. Here, the values of the laser irradiation power density P, the laser scanning speed ss and the short-axis width S of the beam profile in the laser beam are fixed to P=70 [kW/cm²], ss=300 [mm/s], and S=30 [μm], respectively, and Eirr=P×S/ss=7.0 [J/cm²].

Here, if the absorptance of silicon is A, the energy Eabs[J/cm²] absorbed by silicon per unit volume is represented by Eabs=A×Eirr. In addition, if the thickness of the amorphous silicon is d[nm], the energy e_abs[J/cm³] absorbed by silicon per unit volume is represented by e_abs=Eabs/d. Accordingly, e_abs=(A/d)×Eirr. Here, if the thickness d of the amorphous silicon is 45 [nm] and the absorptance A of silicon is 25%, e_abs=5.5×10⁴×Eirr.

FIG. 5B is obtained by converting the energy density Eirr in the horizontal axis of FIG. 5A using the conversion formula. Note that, the irradiation energy density Eirr' in the case of other thickness configuration (A', d') can be obtained from e_abs described above using an equation Eirr'=(d'/A')×e_abs.

As illustrated in FIG. 5B, when the absorption energy of silicon per unit volume is smaller than 2.4×10⁵[J/cm³], the crystalline structure is in the amorphous state having an average crystal grain size smaller than 25 nm.

When the absorption energy of silicon per unit volume is greater than or equal to 2.4×10⁵[J/cm³] and smaller than 3.2×10⁵[J/cm³], the crystalline structure is crystallized in the SPC range, having an average crystal grain size of greater than or equal to 25 nm and smaller than 35 nm.

When the absorption energy of silicon per unit volume is greater than or equal to 3.2×10⁵ [J/cm³] and smaller than 4.1×10⁵ [J/cm³], the crystalline structure is crystallized in the Ex range, having an average crystal grain size of greater than or equal to 40 nm and smaller than 60 nm.

When the absorption energy of silicon per unit volume is greater than or equal to 4.1×10⁵ [J/cm³] and smaller than 5.3×10⁵ [J/cm³], the crystalline structure is crystallized in the melting range, having an average crystal grain size greater than or equal to 60 nm and smaller than 1 μm.

Note that, if the amorphous silicon is irradiated with the laser with the absorption energy of silicon per unit volume greater than or equal to 5.3×10⁵ [J/cm³], the silicon thin film is in the ablation state, and does not function as the channel layer of the TFT.

(Crystallization of Noncrystalline Semiconductor Film Using CW Laser Beam)

Figure 6:
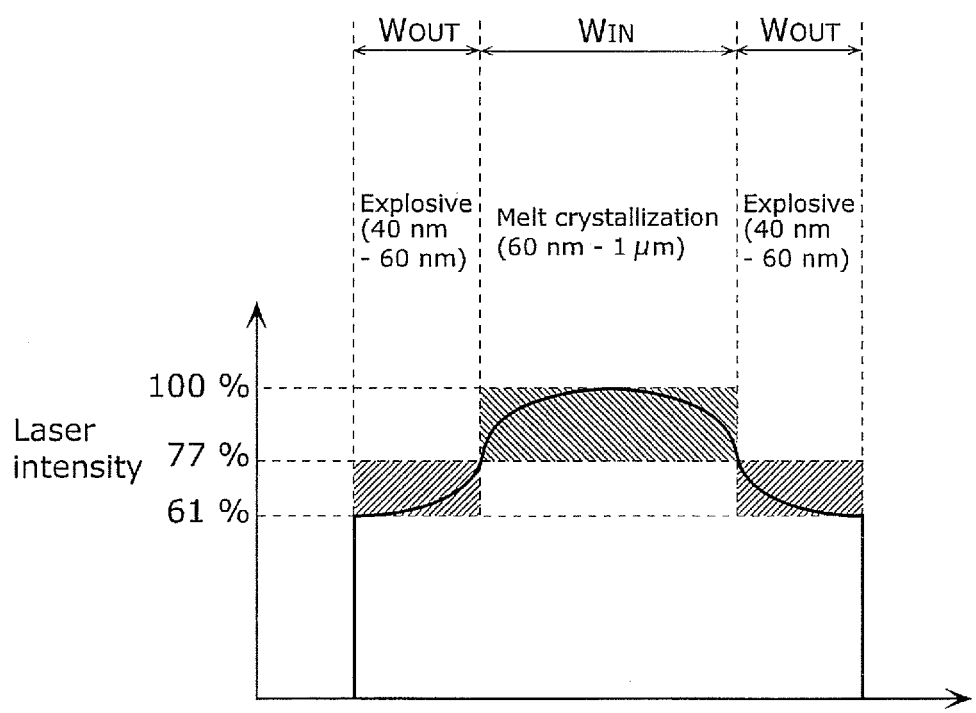
FIG. 6 is a diagram showing a long-axis profile of the CW laser beam in the embodiment.

Next, a method of forming a semiconductor having two regions with different crystalline structures formed at the same time by irradiating the noncrystalline semiconductor film with the CW laser beam using the CW laser beam crystallization device 500 shall be described with reference to FIG. 6. FIG. 6 shows a long-axis profile of the CW laser beam in the embodiment, and shows a relationship between the laser intensity and the crystalline structure of silicon.

The noncrystalline semiconductor film is irradiated with a CW laser beam having a Gaussian long-axis beam profile (hereafter referred to as the "long-axis Gaussian CW laser beam") as shown in FIG. 6 as the CW laser beam having a convex light intensity distribution. Subsequently, the noncrystalline semiconductor film is crystallized in a crystalline structure depending on the light intensity of the CW laser beam. In other words, the beam profile of the CW laser beam differs in light intensity depending on the positions (regions) of the light intensity distribution of the CW laser beam. With this, different laser energy is applied on the noncrystalline semiconductor film by irradiating with laser once. With this, in the noncrystalline semiconductor film irradiated with laser, the temperature of a portion irradiated with a region of high light intensity in the light intensity distribution is relatively high, and the temperature of a portion irradiated with a region of low light intensity in the light intensity distribution is relatively low.

As described above, it is possible to have different temperatures to which the noncrystalline semiconductor film is heated at the time of laser irradiation, depending on the positions of the light intensity distribution of the CW laser beam. Thus, it is possible to form the semiconductor film having different crystalline structures at the same time. For example, by irradiating the noncrystalline silicon thin film with the long-axis Gaussian CW laser beam, the crystalline structure may be in amorphous, the SPC range, the Ex range, or the melting range, depending on the light intensity in the light intensity distribution.

With this, by setting the desired beam profile of the CW laser beam, a semiconductor film having crystalline structures in different ranges, that is, having desired two regions with different crystal grain sizes, among amorphous, the SPC range, the Ex range and the melting range is obtained at the same time. The beam profile of the CW laser beam may be set desirably using FIGS. 5A and 5B, depending on a crystalline structure to be manufactured.

For example, when forming a crystalline structure crystallized in the melting range and a crystalline structure crystallized in the Ex range are formed simultaneously, as illustrated in FIG. 6, if the maximum light intensity in the light intensity distribution of the long-axis Gaussian CW laser beam is 100%, an inner region of the light intensity distribution having a constant width (laser beam inner region) $W_{IN}$ is set to have light intensity of 77% to 100%, and an outer region of the light intensity distribution which is outside of the inner region with a constant width (laser beam outer region) $W_{OUT}$ is set to have light intensity of 61% to 77%. The outer region $W_{OUT}$ is a region continuous to the inner region $W_{IN}$, outside of the inner region $W_{IN}$, and is a region having light intensity lower than the inner region $W_{IN}$. Note that, the outer region $W_{OUT}$ also has a constant width different from the constant width of the inner region $W_{IN}$.

In this case, the output energy of the CW laser beam is, as illustrated in FIG. 5A, when the maximum value of the energy density in the light intensity distribution is 9.6 [J/cm$^2$], the energy density of the inner region in the light intensity distribution (laser beam inner region) $W_{IN}$ may be in a range from 7.4 [J/cm$^2$] to 9.6 [J/cm$^2$]. With regard to the outer region $W_{OUT}$ in the light intensity distribution, the energy density may be set in a range from 5.8 [J/cm$^2$] to 7.4 [J/cm$^2$].

When the amorphous silicon film is irradiated with the long-axis Gaussian CW laser beam with the output energy density set as described above continuously in the predetermined beam scanning direction, the portion irradiated with the inner region $W_{IN}$ of the constant width in the light intensity distribution of the long-axis Gaussian CW laser beam indicates a temperature distribution of the melting range (1414° C. or above), and melts in the melting range, is cooled, and crystallized into a first crystalline semiconductor film is formed. At the same time, the portion irradiated with the outer region $W_{OUT}$ in the light intensity distribution of the long-axis Gaussian CW laser beam indicates the temperature distribution in the Ex range (1100° C. to 1414° C.), and a second crystalline semiconductor film crystallized in the Ex range after the supercooled liquid state is formed.

With this, the first crystalline semiconductor film having the crystalline structure crystallized in the melting range and the second crystalline semiconductor film crystallized in the Ex range may be formed at the same time using a common noncrystalline semiconductor film. Here, the crystal grains of the crystalline silicon film (first crystalline semiconductor film) in the region crystallized in the melting range maintains in-plane uniformity, and the average crystal grain size is from 60 nm to 1 μm. The crystal grains of the crystalline silicon film (the second crystalline semiconductor film) in the region crystallized in the Ex range maintains in-plane uniformity, and the average crystal grain size is from 40 nm to 60 nm.

As described above, according to the embodiment, the crystalline semiconductor film having two regions of different crystalline structures (crystal grain sizes) is collectively formed. Note that, the beam profile illustrated in FIG. 6 is an example, and by setting a desired beam profile, a desired semiconductor film having two regions of different crystalline structures is obtained.

The noncrystalline semiconductor film is preferably irradiated with the laser in the order of microseconds, for example, for 10 to 100 microseconds. More specifically, it is preferable to perform laser irradiation using the long-axis CW laser beam in the order of microseconds, for example, for 10 to 100 microseconds.

As described above, performing the laser irradiation using the long-axis Gaussian CW laser beam in the order of microseconds, instead of the order of nanoseconds extends an irradiation time of the long-axis Gaussian CW laser beam. This secures sufficient time for rearranging the structure of atoms in the amorphous silicon film from the amorphous state and crystallizing, and thereby allowing forming the crystalline semiconductor film having crystalline structure with satisfactory in-plane uniformity.

(Structure of the Thin-Film Transistor Array Device)

Next, a thin-film transistor array device according to an embodiment of the present disclosure shall be described with reference to the drawings.

Figure 7:
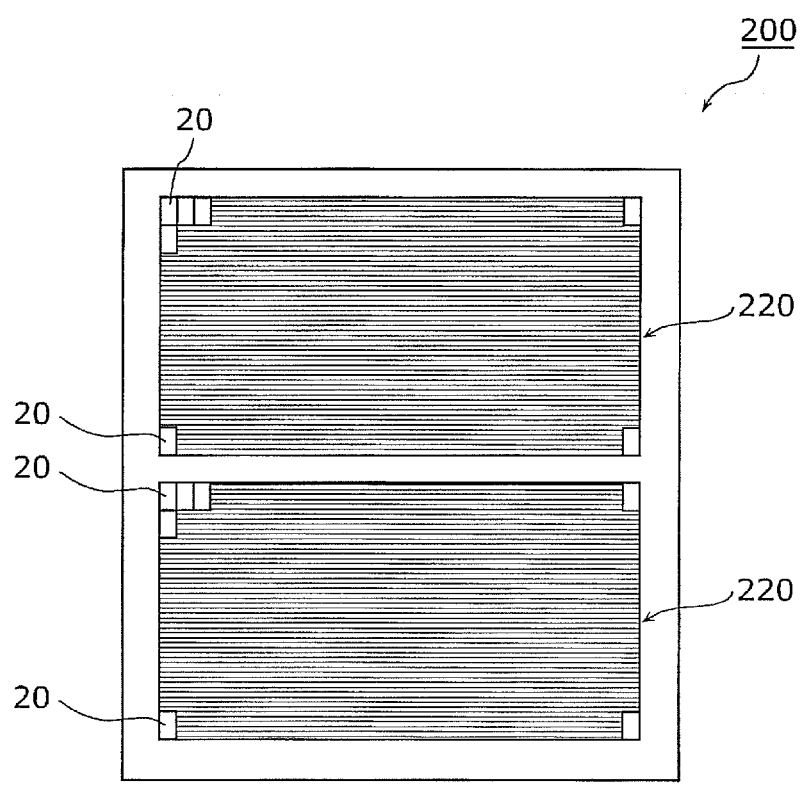
FIG. 7 shows a thin-film transistor array substrate including a thin-film transistor array device according to an embodiment of the present disclosure.
Figure 8:
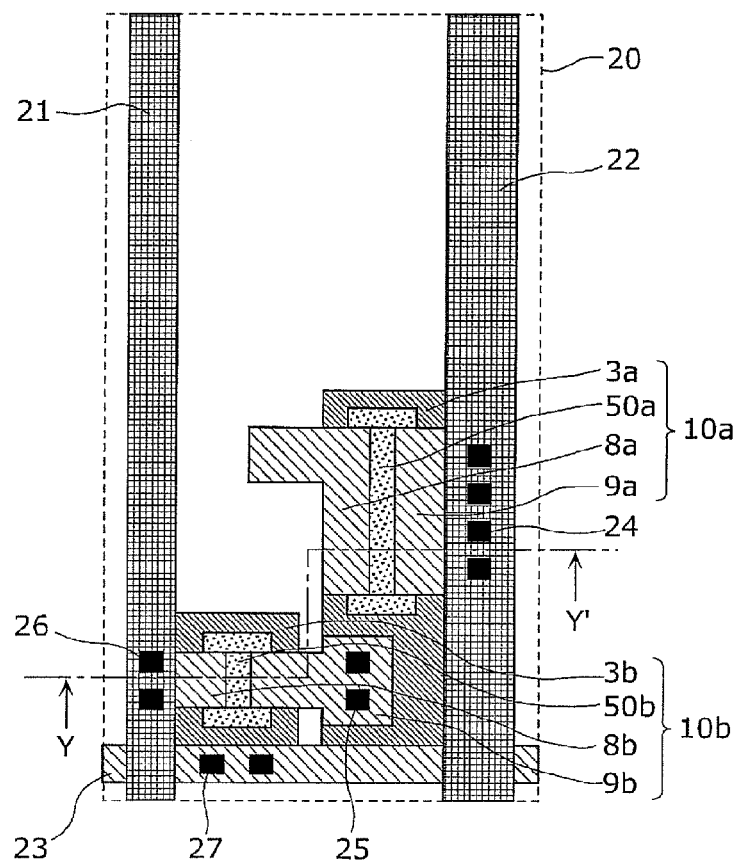
FIG. 8 is a plan view of a pixel structure on the thin-film transistor array substrate shown in FIG. 7.

FIG. 7 shows a thin-film transistor array substrate (TFT array substrate) 200 including a thin-film transistor array device according to the embodiment of the present disclosure. FIG. 8 is a plan view showing a pixel configuration on the TFT array substrate in FIG. 7.

As shown FIG. 7, the TFT array substrate 200 is an active matrix substrate, and includes a display unit 220 in which a plurality of pixels 20 are arranged in a matrix. Note that FIG. 7 shows the TFT array substrate 200 on which two display units 220 are formed, and it is possible to obtain two TFT array substrates by cutting off this TFT array substrate 200. In FIG. 7, the pixels 20 are illustrated only in part of the four corners of the display unit 220, but the pixels 20 are actually arranged in a matrix in the display unit 220.

As shown in FIG. 8, the pixels 20 are partitioned by a source line 21, a power supply line 22, and a gate line 23, and one pixel 20 (unit pixel) includes a driving TFT 10a that is the first thin-film transistor and a switching TFT 10b that is the second thin-film transistor.

The driving TFT (the first thin-film transistor) 10a is a driving thin-film transistor for driving an organic EL element (not shown) and includes: a first gate electrode 3a; a first channel layer 50a formed in an island shape on the first gate electrode 3a; and a first source electrode 8a and a first drain electrode 9a that are formed on the first channel layer 50a.

The switching TFT (the second thin-film transistor) 10b is a switching thin-film transistor for selecting a supply of a video signal to the pixel and includes: a second gate electrode 3b; a second channel layer 50b formed in an island shape on the second gate electrode 3b; and a second source electrode 8b and a second drain electrode 9b that are formed on the second channel layer 50b.

As shown in FIG. 8, in the driving TFT 10a, the first drain electrode 9a is electrically connected to the power supply line 22 via a contact 24, and the first gate electrode 3a is electrically connected to the second drain electrode 9b in the switching TFT 10b via a contact 25. Note that the first source electrode 8a in the driving TFT 10a, though not shown, is electrically connected to a lower electrode in the organic EL element.

In addition, in the switching TFT 10b, the second source electrode 8b is electrically connected to the source line 21 via a contact 26, and the second gate electrode 3b is electrically connected to the gate line 23 via a contact 27. The second drain electrode 9b in the switching TFT 10b, as described earlier, is electrically connected to the first gate electrode 3a in the driving TFT 10a.

Note that the first gate electrode 3a in the driving TFT 10a and the power supply line 22 are configured to overlap with each other in a direction perpendicular to the substrate via an insulating film, and form a capacitor 29 (not shown).

In the thin-film transistor array device according to the embodiment of the present disclosure, the second drain electrode 9b and the first gate electrode 3a are electrically connected to each other. This allows connecting the driving TFT 10a and the switching TFT 10b with the shortest line length. As a result, it is possible to minimize electrical resistance between the driving TFT 10a and the switching TFT 10b. Thus, it is possible to provide a thin-film transistor array device which operates at high speed with smaller power loss. Note that in the configuration, the second source electrode 8b, instead of the second drain electrode 9b, may be electrically connected to the first gate electrode 3a.

Figure 9:
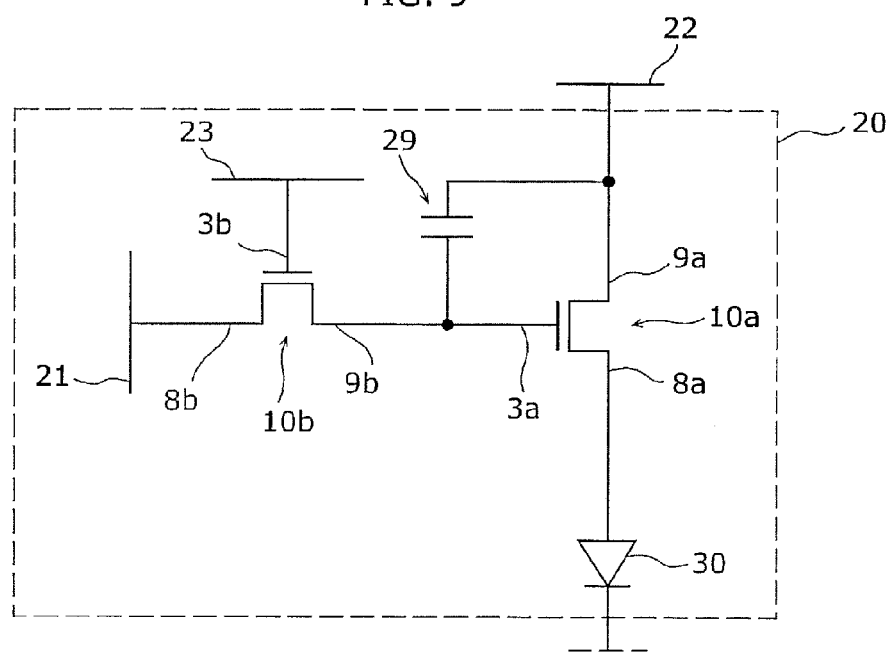
FIG. 9 is a circuit configuration diagram of a pixel of a thin-film transistor array device according to the embodiment of the present disclosure.

Next, a configuration of an equivalent circuit of the pixel thus configured shall be described with reference to FIG. 9. FIG. 9 is a circuit configuration diagram of a pixel of the thin-film transistor array device according to an embodiment of the present disclosure.

As shown in FIG. 9, the pixel 20 includes: the driving TFT 10a, the switching TFT 10b, the capacitor 29, and the organic EL device 30. As described above, the first drain electrode 9a in the driving TFT 10a is connected to the power supply line 22, and the first source electrode 8a is connected to an anode of an organic EL element 30. In addition, the second source electrode 8b in the switching TFT 10b is connected to the source line 21, and the second gate electrode 3b is connected to the gate line 23, and the second drain electrode 9b is connected to the capacitor 29 and the first gate electrode 3a in the driving TFT 10a.

In this configuration, when a gate signal is input into the gate line 23 to turn on the switching TFT 10b, a signal voltage supplied via the source line 21 is written into the capacitor 29. Then, a held voltage, which is written into the capacitor 29, is held through one frame period. This held voltage causes analog change in conductance of the driving TFT 10a, so that drive current corresponding to gradation of emitted light flows from the anode to the cathode of the organic EL element 30. With this, the organic EL element 30 emits light, so that an image is displayed.

Figure 10:
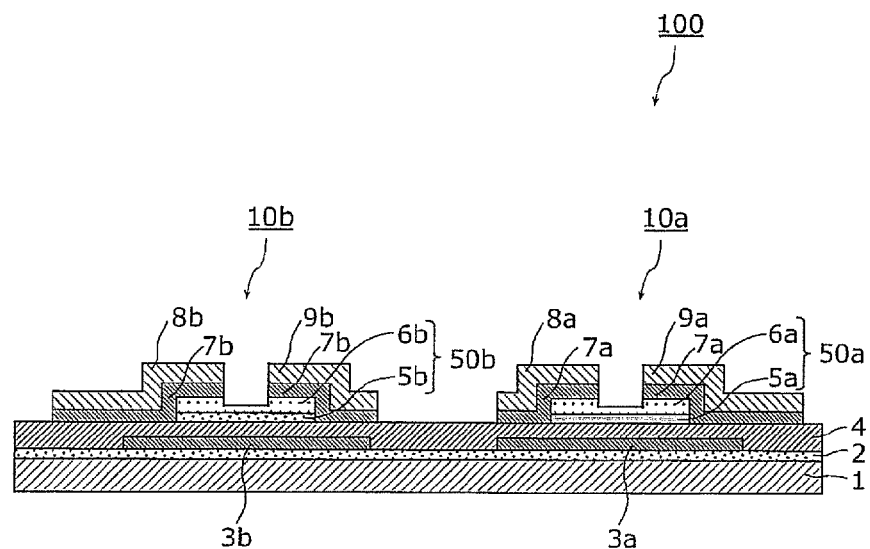
FIG. 10 is a cross-sectional view of a configuration of a thin-film transistor array device according to the embodiment of the present disclosure.

Next, a thin-film transistor array device according to an embodiment of the present disclosure shall be described with reference to FIG. 10. FIG. 10 is a cross-sectional view of a configuration of a thin-film transistor array device according to the embodiment of the present disclosure. Note that FIG. 10 is a cross-sectional view along Y-Y' line in FIG. 8.

As shown in FIG. 10, a thin-film transistor array device 100 according to an embodiment of the present disclosure includes the driving TFT 10a and the switching TFT 10b.

The driving TFT 10a is a bottom-gate thin-film transistor device, and includes: an undercoat layer 2, a first gate electrode 3a, a gate insulating film 4, a first crystalline semiconductor film 5a, a first noncrystalline semiconductor film 6a, a pair of first contact layers 7a, a first source electrode 8a, and a first drain electrode 9a, which are serially formed on a substrate 1. Note that the first channel layer 50a in the driving TFT 10a includes the first crystalline semiconductor film 5a and the first noncrystalline semiconductor film 6a.

The switching TFT 10b is a bottom-gate thin-film transistor device, and includes: the undercoat layer 2, a second gate electrode 3b, the gate insulating film 4, a second crystalline semiconductor film 5b, a second noncrystalline semiconductor film 6b, a pair of second contact layers 7b, a second source electrode 8b, and a second drain electrode 9b, which are serially formed on the substrate 1. Note that the second channel layer 50b in the switching TFT 10b includes the second crystalline semiconductor film 5b and the second noncrystalline semiconductor film 6b.

Hereinafter, a configuration of each of the driving TFT 10a and the switching TFT 10b shall be described in further detail.

The substrate 1 is common to the driving TFT 10a and the switching TFT 10b, and is a glass substrate made of, for example, a glass material such as silica glass, alkali-free glass, or highly heat-resistant glass.

The undercoat layer 2 is formed on the substrate 1 to prevent an impurity included in the substrate 1 from entering the semiconductor film that is an upper layer, and to reduce the effect of heat on the substrate 1 in a high-temperature thermal treatment process such as laser annealing. A silicon nitride film, a silicon oxide film, or a silicon oxynitride film may be used as the undercoat layer 2.

The first gate electrode 3a and the second gate electrode 3b are patterned on the undercoat layer 2, in a predetermined shape. The first gate electrode 3a and the second gate electrode 3b are made of single-layer structure or a multi-layer structure of molybdenum (Mo), aluminum (Al), copper (Cu), tungsten (W), titanium (Ti), and chromium (Cr), and molybdenum-tungsten (MoW) may be used, for example.

The gate insulating film 4 is common to the driving TFT 10a and the switching TFT 10b, and is formed on the entire surface of the substrate 1 and on the first gate electrode 3a and the second gate electrode 3b, covering the first gate electrode 3a and the second gate electrode 3b. The gate insulating film 4 is made of, for example, silicon oxide, silicon nitride, a silicon oxynitride film, aluminum oxide, or tantalum oxide, or a stacked film of the materials.

The first crystalline semiconductor film 5a in the driving TFT 10a is formed on the gate insulating film 4, and is formed by crystallizing a noncrystalline semiconductor film by the CW laser beam. An average grain size (first average grain size) of the first crystalline semiconductor film 5a is 60 nm to 1 μm. In the embodiment, the first crystalline semiconductor film 5a may be a silicon thin film which includes mixed crystals having a noncrystalline amorphous silicon structure and a crystalline silicon structure.

The second crystalline semiconductor film 5b in the switching TFT 10b is also formed on the gate insulating film 4, and is formed by crystallizing a noncrystalline semiconductor film using the CW laser beam. However, the average grain size (second average grain size) of the second crystalline semiconductor film 5b is smaller than the average grain size of the first crystalline semiconductor film 5a, and is from 40 nm to 60 nm. In the embodiment, the second crystalline semiconductor film 5b may also be a silicon thin film which includes mixed crystals having a noncrystalline amorphous silicon structure and a crystalline silicon structure.

Note that, as described later, the first crystalline semiconductor film 5a and the second crystalline semiconductor film 5b having different crystal grain sizes are formed at the same time by laser irradiation in the same process.

The first noncrystalline semiconductor film 6a in the driving TFT 10a and the second noncrystalline semiconductor film 6b in the switching TFT 10b are formed on the first crystalline semiconductor film 5a and the second crystalline semiconductor film 5b, respectively, and each of the first and second noncrystalline semiconductor films 6a and 6b is formed as an amorphous silicon film, for example.

The pair of first contact layers 7a and the pair of second contact layers 7b are formed on the first noncrystalline semiconductor film 6a and the second noncrystalline semiconductor film 6b, respectively. The pair of the first contact layer 7a and the pair of the second contact layer 7b are formed as amorphous semiconductor films including an impurity in high concentration, and may be n-type semiconductor layers formed by doping phosphorous (P) in the amorphous silicon film as the impurity. It is preferable that the pair of first contact layers 7a and the pair of the second contact layers 7b include a high concentration of impurity of $1 \times 10^{19}$ (atm/cm$^3$) or above.

In the driving TFT 10a, the first source electrode 8a and the first drain electrode 9a are formed on the first contact layers 7a. In addition, in the switching TFT 10b, the second source electrode 8b and the second drain electrode 9b are formed on the second contact layers 7b. Each of the first source electrode 8a, the first drain electrode 9a, the second source electrode 8b, and the second drain electrode 9b is a single-layer structure or multi-layer structure that is made of a conductive material, or an alloy of the conductive material, and is made of, for example, aluminum (Al), molybdenum (Mo), tungsten (W), copper (Cu), titanium (Ti), chromium (Cr), and others.

As described above, in the thin-film transistor array device 100 according to an embodiment of the present disclosure, the driving TFT 10a having the first crystalline semiconductor film 5a with a relatively large average grain size as the channel layer, and the switching TFT 10b having the second crystalline semiconductor film 5b with a relatively small average grain size as the channel layer may be formed.

Accordingly, for the driving TFT 10a, it is possible to increase the turn-on current by using the first crystalline semiconductor film 5a having larger crystal grains. In addition, for the switching TFT 10b, it is possible to increase the turn-on current as compared to a TFT including a semiconductor film having an amorphous structure as the channel layer, and also to suppress the turn-off current as compared to a TFT including a semiconductor film having a large crystal grain size as the channel layer. Therefore, a thin-film transistor array device having the driving TFT 10a having satisfactory turn-on characteristics and the switching TFT having good turn-off characteristics and satisfactory turn-on characteristics are implemented.

Note that in the embodiment, the first crystalline semiconductor film 5a and the second crystalline semiconductor film 5b are spaced apart. This prevents carriers of electrons or holes from flowing into the first crystalline semiconductor film 5a and the second crystalline semiconductor film 5b. As a result, it is possible to operate, without interfering with each other, the driving TFT 10a including the first crystalline semiconductor film 5a as the channel layer and the switching TFT 10b including the second crystalline semiconductor film 5b as the channel layer.

(Configuration of the Organic EL Display Device)

Figure 11:
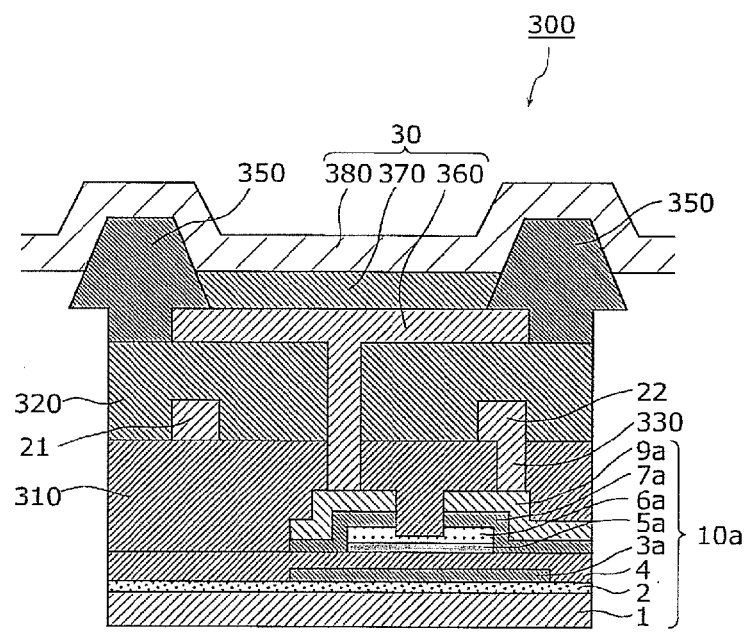
FIG. 11 is a cross-sectional view, in one pixel, of an organic EL display device according to the embodiment of the present disclosure.

Next, an organic EL display device 300 according to an embodiment of the present disclosure shall be described with reference to FIG. 11. FIG. 11 is a cross-sectional view, in one pixel, of an organic EL display device according to an embodiment of the present disclosure.

The organic EL display device 300 according to an embodiment of the present disclosure includes the thin-film transistor array device 100 including the driving TFT 10a and the switching TFT 10b as described above, and the thin-film transistor array device 100 is provided in each of the plurality of pixels 20 in the TFT array substrate 200 as described above and shown in FIG. 7.

As shown in FIG. 11, the organic EL display device 300 according to the present embodiment includes: on the TFT array substrate 200 on which the driving TFT 10a and the switching TFT 10b (not shown) are formed, a first interlayer insulating film 310, a second interlayer insulating film 320, a first contact portion 330, a second contact portion 340, a bank 350, a lower electrode 360, an organic EL layer 370, and an upper electrode 380. Note that, in FIG. 11, the driving TFT 10a is illustrated, but the switching TFT 10b is not illustrated.

As shown in FIG. 11, the first interlayer insulating film 310 is formed to cover the driving TFT 10a and the switching TFT 10b. On the first interlayer insulating film 310, the source line 21 and the power supply line 22 are formed, and the power supply line 22 and the first drain electrode 9a in the driving TFT 10a are electrically connected to each other via the first contact portion 330 which penetrates the first interlayer insulating film 310. In addition, the second interlayer insulating film 320 is formed to cover the source line 21 and the power supply line 22.

On the second interlayer insulating film 320, the bank 350 is formed at a boundary between adjacent pixels. Accordingly, multiple banks 350 are formed on the TFT array substrate 200, and an opening is formed with adjacent banks 350. In the opening between the banks 350, the organic EL device 30 including the lower electrode 360, the organic EL layer 370, and the upper electrode 380 is formed.

The lower electrode 360 is an anode provided for each pixel, on the second interlayer insulating film 320. The lower electrode 360 and the first source electrode 8a in the driving TFT 10a are electrically connected to each other via the second contact portion 340 which penetrates the first interlayer insulating film 310 and the second interlayer insulating film 320.

The organic EL layer (organic light-emitting layer) 370 is formed for each color (sub-pixel column) or for a sub-pixel, and made of a predetermined organic light-emitting material.

The upper electrode 380 is a cathode provided above the organic EL layer 370 and across a plurality of pixels, and is formed as a transparent electrode such as ITO.

As described above, in the organic EL display device 300 according to an embodiment of the present disclosure, the first crystalline semiconductor film 5a in the driving TFT 10a has an average grain size of 60 nm to 1 μm, which increases the current flowing in the first channel layer 50a of the driving TFT 10a. As a result, it is possible to increase an amount of current for light-emission of the pixels 20, thus allowing increase in luminance of the light emitted by the organic EL display device 300.

In addition, since the average grain size of the second crystalline semiconductor film 5b in the switching TFT 10b is 40 nm to 60 nm, it is possible to configure a TFT which operates faster than a switching TFT including a semiconductor film having an amorphous structure as the channel layer and to suppress the turn-off current as compared to a TFT including a semiconductor film having a large grain size as the channel layer. As a result, it is possible to implement an organic EL display device having an advantage in characteristics for moving pictures. Thus, it is possible to realize an organic EL display device that achieves high luminance of emitted light and high-speed display.

(Thin-Film Transistor Array Device Manufacturing Method)

Next, a method of manufacturing the thin-film transistor array device 100 according to the embodiment of the present disclosure shall be described with reference to the drawings.

Figure 12A:
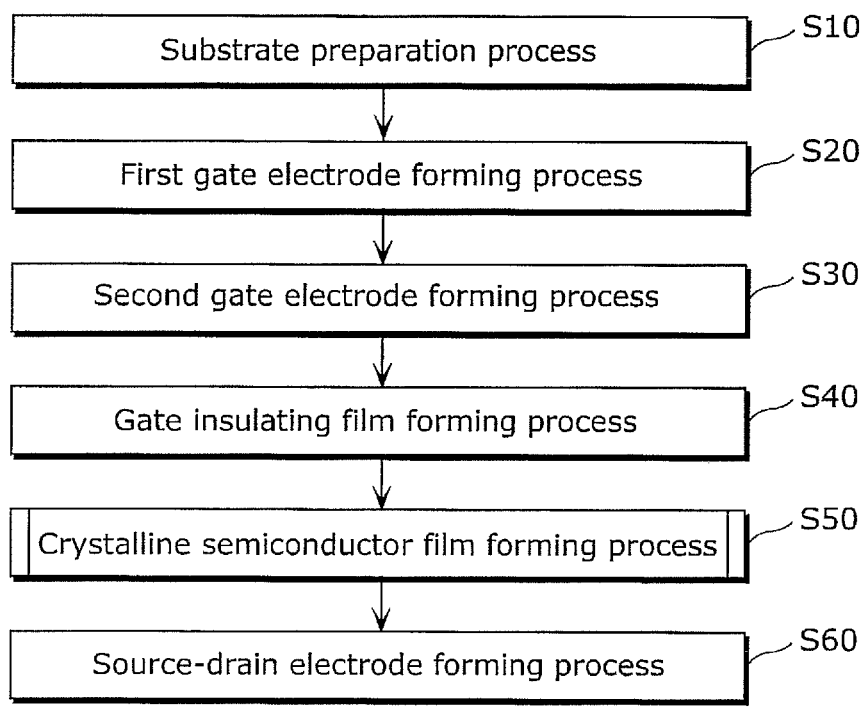
FIG. 12A is a flowchart of a method of manufacturing a thin-film transistor array device according to the embodiment of the present disclosure.
Figure 12B:
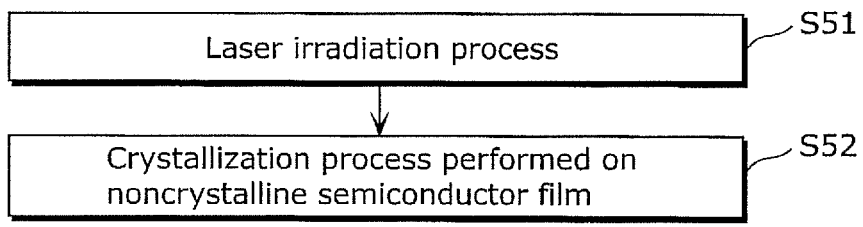
FIG. 12B is a flowchart of a crystalline semiconductor film forming process in the method of manufacturing the thin-film transistor array device according to the embodiment of the present disclosure.

FIG. 12A is a flowchart for describing a method of manufacturing a thin-film transistor array device according to the embodiment of the present disclosure. FIG. 12B is a flowchart for describing a crystalline semiconductor film forming process in the method of manufacturing the thin-film transistor array device according to the embodiment of the present disclosure.

As shown in FIG. 12A, the method of manufacturing the thin-film transistor array device 100 according to the embodiment of the present disclosure includes: a substrate preparation process which is the first process (S10); a first gate electrode forming process which is the second process (S20); a second gate electrode forming process which is the third process (S30); a gate insulating film forming process which is the fourth process (S40); a crystalline semiconductor film forming process which is the fifth process (S50); and a source-drain electrode forming process which is the sixth process (S60) in order. Furthermore, as shown in FIG. 12B, the crystalline semiconductor film forming process which is the fifth process (S50) includes: a laser irradiation process on a noncrystalline semiconductor film (S51) which is the process 5-1; and a crystallization process performed on the noncrystalline semiconductor film (S52) which is the process 5-2.

Next, a specific method of manufacturing the thin-film transistor array device 100 according to the embodiment of the present disclosure shall be described with reference to FIGS. 13A to 13M. FIGS. 13A to 13M are sets of a plan view and a cross-sectional view, schematically showing processes in the thin-film transistor array device manufacturing method according to the embodiment of the present disclosure. Note that, in each set of figures, a plan view is shown on the left and a cross-sectional view of the plan view along Y-Y' line is shown on the right.

Figure 13A:
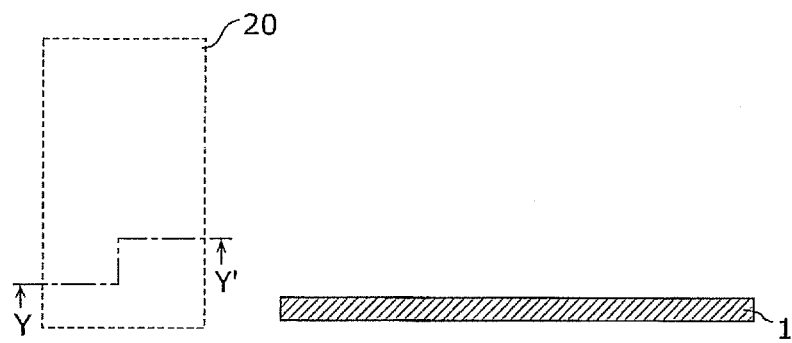
FIG. 13A is a plan view and a cross-sectional view schematically showing a substrate preparation process in the method of manufacturing a thin-film transistor array device according to the embodiment of the present disclosure.

First, as shown in FIG. 13A, the substrate 1 made of glass substrate is prepared (S10). Subsequently, on the substrate 1, the undercoat layer 2 including an insulating film such as a silicon nitride film is formed by plasma chemical vapor deposition (CVD) or others.

Figure 13B:
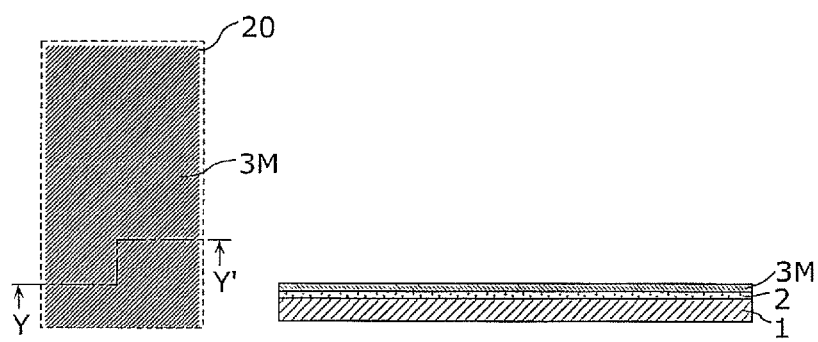
FIG. 13B is a plan view and a cross-sectional view schematically showing a gate metal film forming process in the method of manufacturing the thin-film transistor array device according to the embodiment of the present disclosure.

Next, after cleansing the undercoat layer 2 with pure water or the like, a gate metal film 3M having a film thickness of approximately 50 nm is formed on the under coat layer 2, as illustrated in FIG. 13B. In the present embodiment, the gate metal film 3M including molybdenum tungsten (MoW) is formed by sputtering.

Figure 13C:
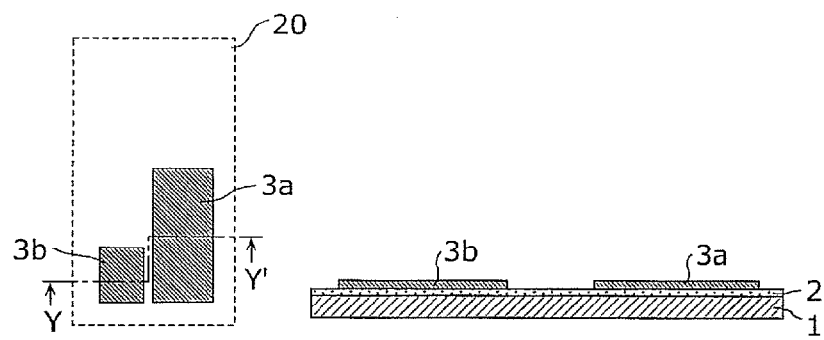
FIG. 13C is a plan view and a cross-sectional view schematically showing a gate electrode forming process in the method of manufacturing the thin-film transistor array device according to the embodiment of the present disclosure.

Next, as shown in FIG. 13C, each of the first gate electrode 3a and the second gate electrode 3b is formed into a predetermined shape by patterning the gate metal film 3M through photolithography and wet etching (S20, S30).

Figure 13D:
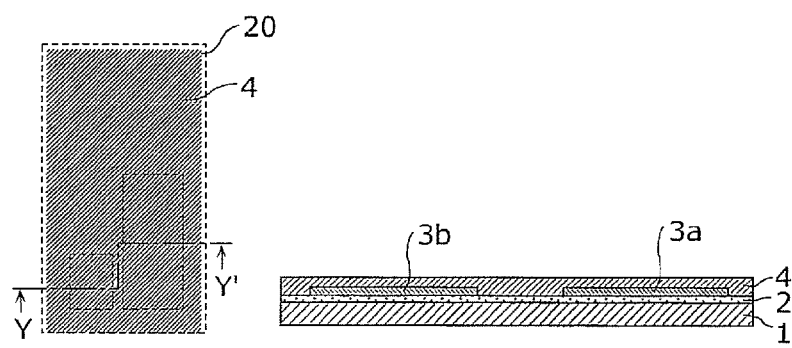
FIG. 13D is a plan view and a cross-sectional view schematically showing a gate insulating film forming process in the method of manufacturing the thin-film transistor array device according to the embodiment of the present disclosure.

Next, as shown in FIG. 13D, the gate insulating film 4 made of silicon dioxide and having a film thickness of approximately 100 nm, for example, is formed on the first gate electrode 3a and the second gate electrode 3b, to cover these first and second gate electrodes 3a and 3b (S40). Note that the gate insulating film 4 can be formed by plasma CVD or the like.

Figure 13E:
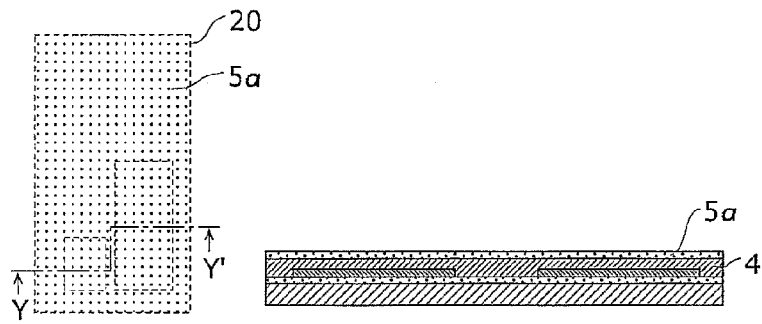
FIG. 13E is a plan view and a cross-sectional view schematically showing a noncrystalline semiconductor film forming process in the method of manufacturing the thin-film transistor array device according to the embodiment of the present disclosure.

Next, as shown in FIG. 13E, a noncrystalline semiconductor film 5a is formed in a first region which is above the first gate electrode 3a and on the gate insulating film 4 and in a second region which is above the second gate electrode 3b and on the gate insulating film 4. For example, an amorphous silicon film and having a thickness of approximately 50 nm, for example, is formed on the entire surface of the gate insulating film 4 as the noncrystalline semiconductor film 5a. Note that it is also possible to form the noncrystalline semiconductor film 5a by plasma CVD or the like.

Subsequently, dehydrogenation processing is performed as a preliminary preparation for irradiating the noncrystalline semiconductor film 5a with the long-axis Gaussian CW laser beam. More specifically, annealing is performed at 400° C. to 500° C. for 30 minutes. This annealing is performed because: the noncrystalline semiconductor film 5a formed as an amorphous silicon film normally contains 5% to 15% hydrogen as SiH, and when crystallizing the noncrystalline semiconductor film 5a that keeps such hydrogen content, not only does the hydrogen block the bonds of silicon to inhibit crystallization but also increases the possibility of a phenomenon like bumping.

Figure 13F:
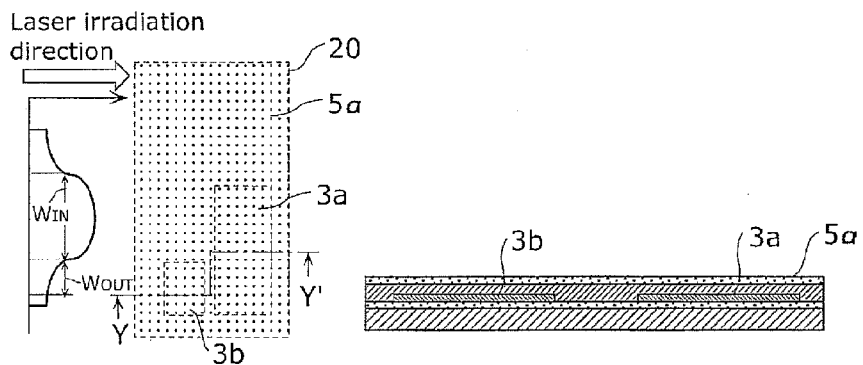
FIG. 13F is a plan view and a cross-sectional view schematically showing a crystalline semiconductor film forming process (laser irradiation process) in the method of manufacturing the thin-film transistor array device according to the embodiment of the present disclosure.

Next, as shown in FIG. 13F, using the CW laser beam crystallization device shown in FIG. 1, the noncrystalline semiconductor film 5a is crystallized by irradiating the noncrystalline semiconductor film 5a with the long-axis Gaussian CW laser beam having a light intensity distribution that is shaped as shown in FIG. 2A (S50).

More specifically, the noncrystalline semiconductor film 5a is irradiated with the long-axis Gaussian CW laser beam with the beam profile as illustrated in FIG. 6 (S51). Note that the long-axis Gaussian CW laser beam is shot in the order of microseconds.

In this processing, according to the embodiment, the noncrystalline semiconductor film 5a located in the first region on the gate insulating film 4 and above the first gate electrode 3a is irradiated with the inner region $W_{IN}$ having a constant width in the light intensity distribution of the long-axis Gaussian CW laser beam.

In addition, the noncrystalline semiconductor film 5a located in the second region on the gate insulating film 4 and above the second gate electrode 3b is irradiated with the outer region $W_{OUT}$ in the light intensity distribution of the long-axis Gaussian CW laser beam.

Figure 13G:
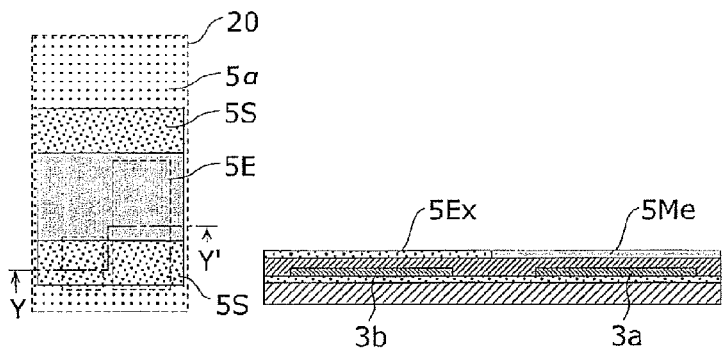
FIG. 13G is a plan view and a cross-sectional view schematically showing a crystalline semiconductor film forming process (crystallization process) in the method of manufacturing the thin-film transistor array device according to the embodiment of the present disclosure.

With this, as shown in FIG. 13G, the portion of the noncrystalline semiconductor film 5a irradiated with the laser beam inner region $W_{IN}$ is heated in the temperature range higher than or equal to 1414° C. (melting range) and melts. Subsequently, the noncrystalline semiconductor film 5a that is melt is crystallized by cooling, so as to form the crystalline semiconductor film 5Me having crystal structure crystallized in the melting range (S52).

As illustrated in FIG. 13G, the portion at which the noncrystalline semiconductor film 5a is irradiated with the laser beam outer region $W_{OUT}$ becomes a crystalline semiconductor film 5Ex having a crystal structure that becomes crystallized within the temperature range of 1100° C. to 1414° C. (Ex range).

Subsequently, hydrogen plasma treatment using hydrogen plasma is performed. In the hydrogen plasma treatment, hydrogen termination treatment is performed on the noncrystalline semiconductor film 5a irradiated with the laser beam (the crystalline semiconductor film 5Me, the crystalline semiconductor film 5Ex) and the noncrystalline semiconductor film 5a unirradiated with the laser beam. The hydrogen plasma treatment is performed by generating hydrogen plasma from a gas including hydrogen gas such as $H_2$ or H2/argon (Ar), using radio frequency electricity.

Figure 13H:
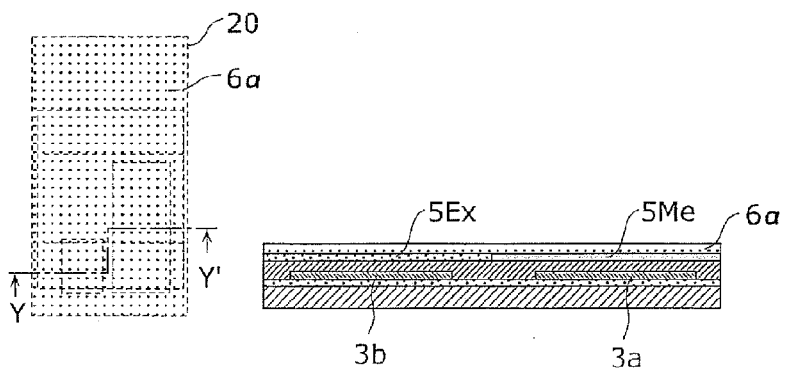
FIG. 13H is a plan view and a cross-sectional view schematically showing a noncrystalline semiconductor film forming process in the method of manufacturing the thin-film transistor array device according to the embodiment of the present disclosure.

Next, as shown in FIG. 13H, the noncrystalline semiconductor film 6a having a film thickness of approximately 100 nm is formed, for example. More specifically, the noncrystalline semiconductor film 6a is formed as an amorphous silicon film by the plasma CVD method, on the crystalline semiconductor film 5Me (first crystalline semiconductor film 5a), the crystalline semiconductor film 5Ex (second crystalline semiconductor film 5b), and the noncrystalline semiconductor film 5a unirradiated with a laser.

Figure 13I:
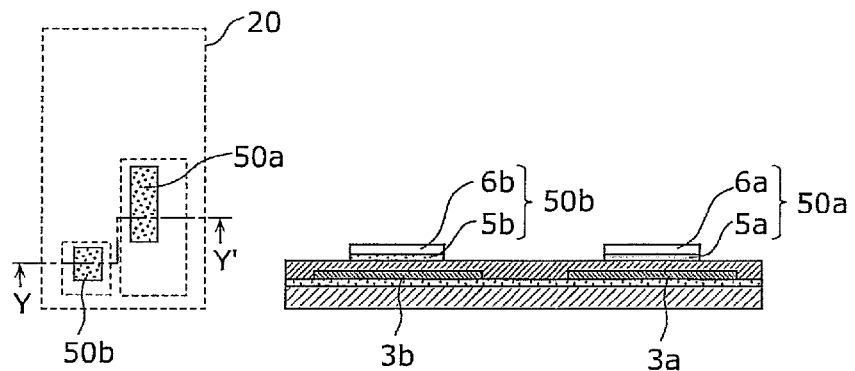
FIG. 13I is a plan view and a cross-sectional view schematically showing a channel layer island forming process in the method of manufacturing the thin-film array device according to the embodiment of the present disclosure.

Next, as shown in FIG. 13I, the first crystalline semiconductor film 5a and the first noncrystalline semiconductor film 6a are formed in island form by selectively patterning, by photolithography and wet etching, the crystalline semiconductor film 5Me and the noncrystalline semiconductor film 6a that are stacked. At the same time, the second crystalline semiconductor film 5b and the second noncrystalline semiconductor film 6b are formed in island form by selectively patterning the crystalline semiconductor film 5Ex and the noncrystalline semiconductor film 6a that are stacked.

As described above, by removing a boundary portion between the first crystalline semiconductor film 5a (the first noncrystalline semiconductor film 6a) and the second crystalline semiconductor film 5b (the second noncrystalline semiconductor film 6b) through patterning, the first crystalline semiconductor film 5a (the first noncrystalline semiconductor film 6a) and the second crystalline semiconductor film 5b (the second noncrystalline semiconductor film 6b) are formed spaced apart.

With this, the first channel layer 50a in which the first crystalline semiconductor film 5a and the first noncrystalline semiconductor film 6a are stacked and the second channel layer 50b in which the second crystalline semiconductor film 5b and the second noncrystalline semiconductor film 6b are stacked are formed.

Figure 13J:
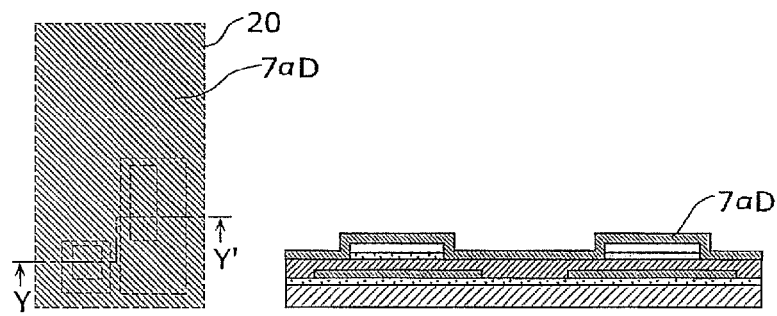
FIG. 13J is a plan view and a cross-sectional view schematically showing an impurity-doped noncrystalline semiconductor film forming process in the method of manufacturing the thin-film transistor array device according to the embodiment of the present disclosure.

Next, as shown in FIG. 13J, an impurity-doped amorphous semiconductor film 7aD that is to be the first contact layers 7a and the second contact layers 7b is formed by: forming an amorphous semiconductor film as an amorphous silicon film by the plasma CVD or others, and doping an impurity in the amorphous semiconductor film. For the impurity, for example, a quinquevalent element such as phosphorous can be used. In addition, doping is performed such that the impurity concentration is at a high level.

Figure 13K:
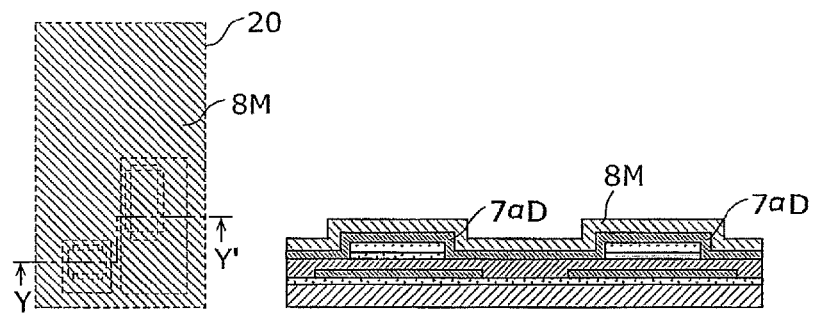
FIG. 13K is a plan view and a cross-sectional view schematically showing a source-drain metal film forming process in the method of manufacturing the thin-film transistor array device according to the embodiment of the present disclosure.

Next, as shown in FIG. 13K, a source-drain metal film 8M is formed on the impurity-doped amorphous semiconductor film 7aD. The material for the source-drain metal film 8M is the material used for forming the first source electrode 8a, the first drain electrode 9a, the second source electrode 8b, and the second drain electrode 9b. According to the present embodiment, the source-drain metal film 8M having a tri-layer structure of MoW/Al/MoW is formed by the sputtering method.

Figure 13L:
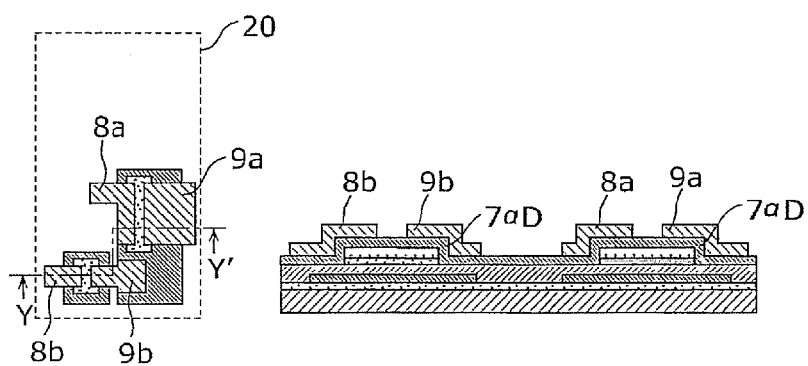
FIG. 13L is a plan view and a cross-sectional view schematically showing a source-drain electrode forming process in the method of manufacturing the thin-film transistor array device according to the embodiment of the present disclosure.

Next, as shown in FIG. 13L, the source-drain metal film 8M is patterned by photolithography and wet etching. With this, the first source electrode 8a and the first drain electrode 9a, and the second source electrode 8b and the second drain electrode 9b are formed (S60).

Figure 13M:
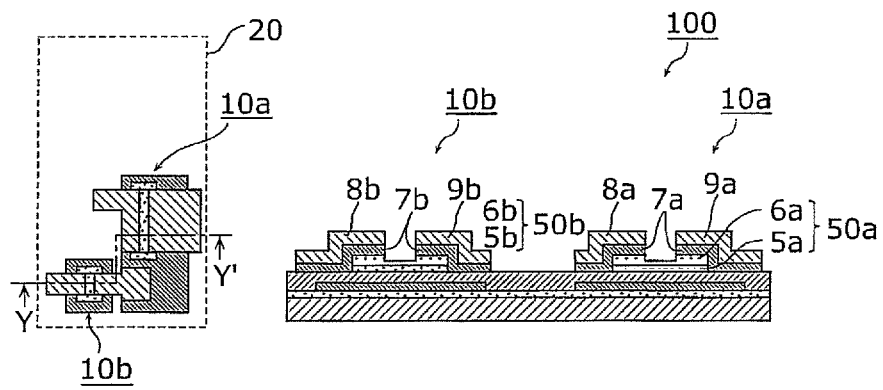
FIG. 13M is a plan view and a cross-sectional view schematically showing a channel layer etching process in the method of manufacturing the thin-film transistor array device according to the embodiment of the present disclosure.

Subsequently, with the resist (not shown) for patterning the source-drain metal film 8M left unremoved, top portions of the first noncrystalline semiconductor film 6a and the second noncrystalline semiconductor film 6b are etched by dry etching, as shown in FIG. 13M. This allows separating the impurity-doped amorphous semiconductor film 7aD, to form the pair of the first contact layers 7a and the pair of the second contact layers 7b that are n$^+$ layers. In addition, by etching the top layer of the amorphous semiconductor film 7aD, it is possible to form the first channel portion 50a and the second channel portion 50b each of which has a desired film thickness.

This allows manufacturing of the thin-film transistor array device 100 according to the embodiment of the present disclosure.

Note that each specific process is not shown, but subsequently, as shown in FIG. 11, it is possible to manufacture an organic EL display device by forming: the first interlayer insulating film 310, the second interlayer insulating film 320, the first contact portion 330, the second contact portion 340, the bank 350, the lower electrode 360, the organic EL layer 370 and the upper electrode 380, and the source line 21, the power supply line 22, and the gate line 23.

Figure 14:
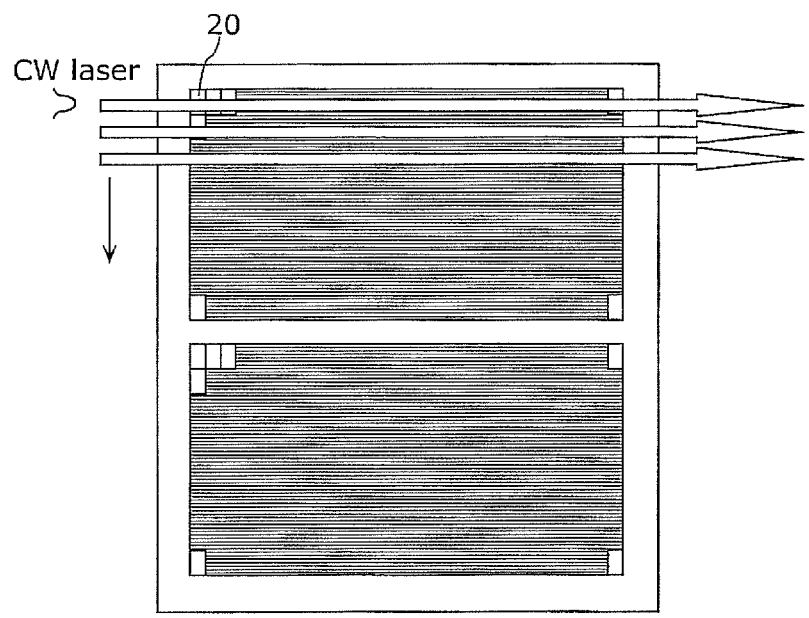
FIG. 14 is a diagram related to the method of manufacturing the thin-film transistor array device according to the embodiment of the present disclosure and schematically showing a state in which beam scanning is performed across an entire display unit.

Although the description above has been based on one pixel, it is possible to form, likewise, the thin-film transistor array device included in another pixel. The following shall describe the beam scanning method using the CW laser, which is performed across the entire display unit including a plurality of pixels with reference to FIG. 14. FIG. 14 is a diagram related to the method of manufacturing the thin-film transistor array device according to an embodiment of the present disclosure and schematically showing a state in which beam scanning is performed across an entire display unit.

As shown in FIG. 14, the beam scanning method using the long-axis Gaussian CW laser beam in the present embodiment described above is to perform laser irradiation, for each line, on the plurality of pixels 20 arranged in a matrix made up of lines and columns. In this processing, as described in FIG. 13G, the laser irradiation is performed such that the noncrystalline semiconductor film 5a at the portion that is to be the first crystalline semiconductor film 5a in the driving TFT 10a is irradiated with the laser beam inner region $W_{IN}$ in the light intensity distribution of the CW laser beam. In addition, the laser irradiation is performed so that the noncrystalline semiconductor film 5a in the portion that is to be the second crystalline semiconductor film 5b in the switching TFT 10b is irradiated with the laser beam outer region $W_{OUT}$ in the light intensity distribution of the CW laser beam.

Figure 15:
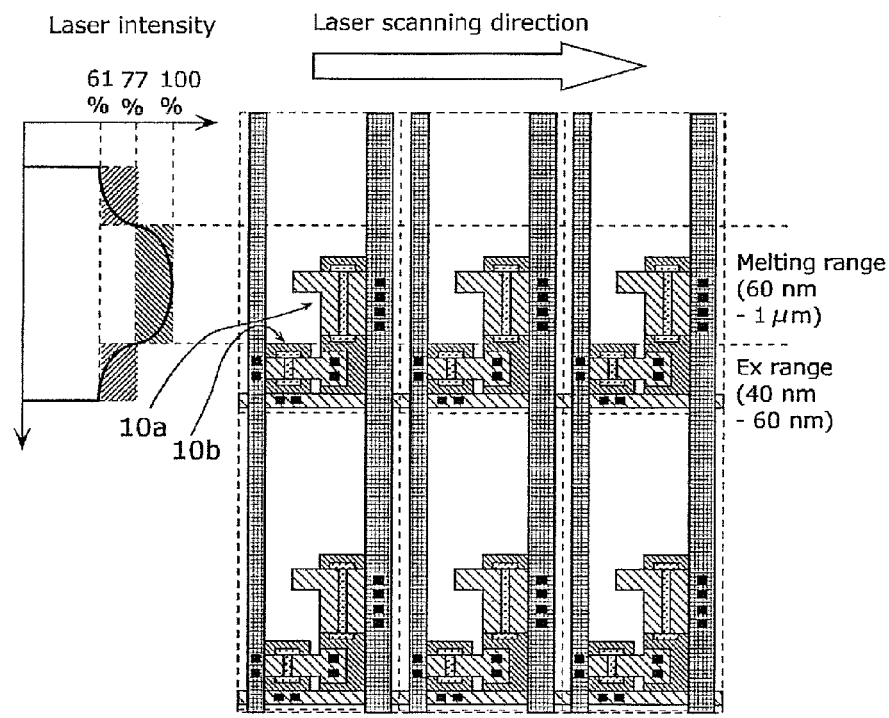
FIG. 15 is a diagram showing a beam profile and a laser irradiation position in pixels in the method of manufacturing the thin-film transistor array device according to the embodiment of the present disclosure.

FIG. 15 is an enlarged view of the laser irradiation. As illustrated in FIG. 15, in the embodiment, the laser irradiation is performed for each line by continuously scanning the pixels 20 arranged in row direction. Note that, in FIG. 15, in order to clearly illustrate the positional relationship between the driving TFT 10a and the switching TFT 10b with respect to the light intensity distribution of the laser beam, components such as electrodes of the transistors that do no exist at the time of laser irradiation are also illustrated.

Note that in the present embodiment, sequential scanning is unidirectionally performed from left to right, but the scanning may be performed turning in an opposite direction at an end of each line, that is, by scanning the first line from left to right, and scanning the next line, the second line from right to left.

Figure 16:
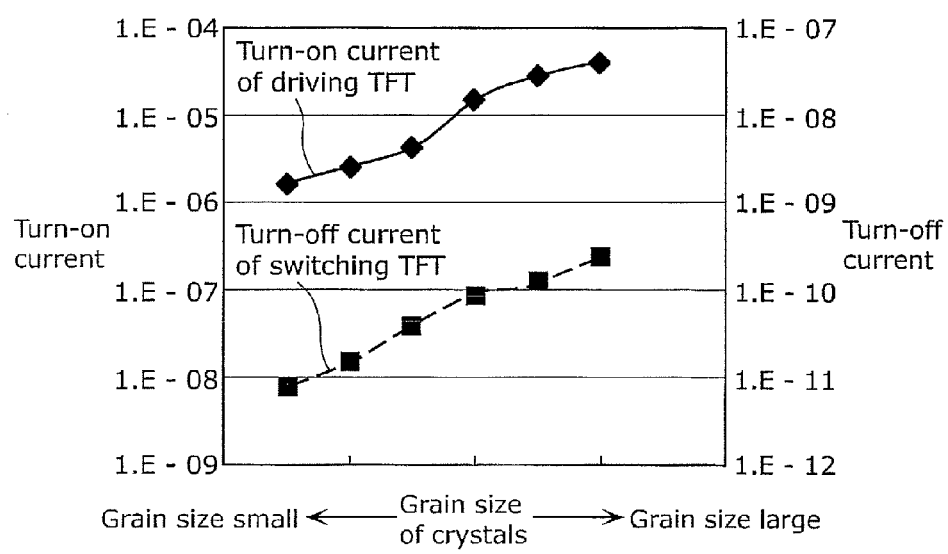
FIG. 16 is a diagram showing current characteristics with respect to crystal grain size in the thin-film transistor array device according to the embodiment of the present disclosure.

Next, current characteristics of the thin-film transistor array device 100 manufactured according to the manufacturing method of the present embodiment shall be described with reference to FIG. 16. FIG. 16 is a diagram showing current characteristics with respect to the grain size of crystals in the thin-film transistor array device according to an embodiment of the present disclosure.

As shown in FIG. 16, in the thin-film transistor array device 100 according to the present embodiment, it is possible to form, in the first channel portion 50a in the driving TFT 10a, the first crystalline semiconductor film 5a having a relatively large average grain size of 60 μm to 1 nm, thus allowing increasing the turn-on current in the driving TFT 10a. In addition, it is possible to form, in the second channel layer 50b in the switching TFT 10b, the second crystalline semiconductor 5b having a relatively small average grain size of 40 nm to 60 nm, thus allowing reducing the turn-off current in the switching TFT 10b.

As described above, according to the method of manufacturing the thin-film transistor array device 100 in the embodiment, it is possible to form, at the same time, the driving TFT 10a having high turn-on current and satisfactory turn-on characteristics and the switching TFT 10b having low turn-off current and satisfactory turn-off characteristics.

Figure 17A:
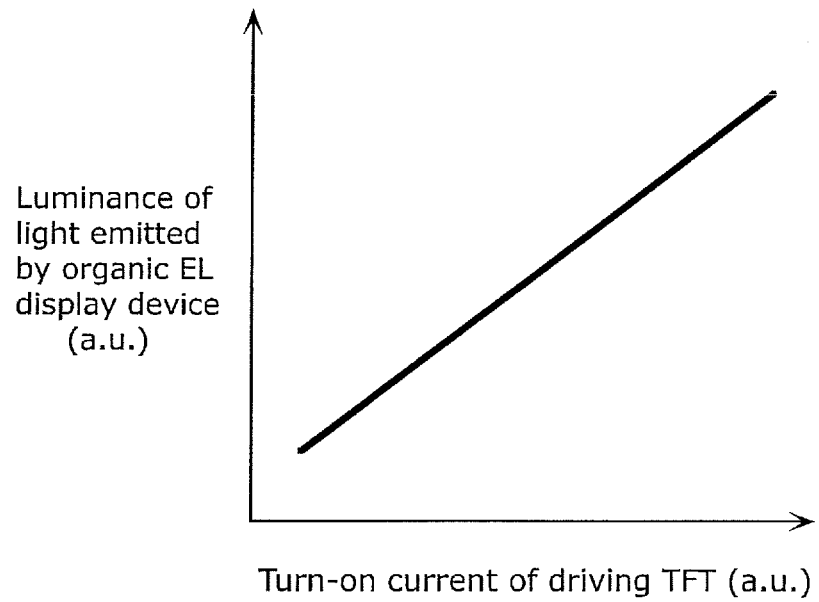
FIG. 17A is a diagram showing a relationship between turn-on current of the driving TFT and luminance of light emitted by an organic EL display device.
Figure 17B:
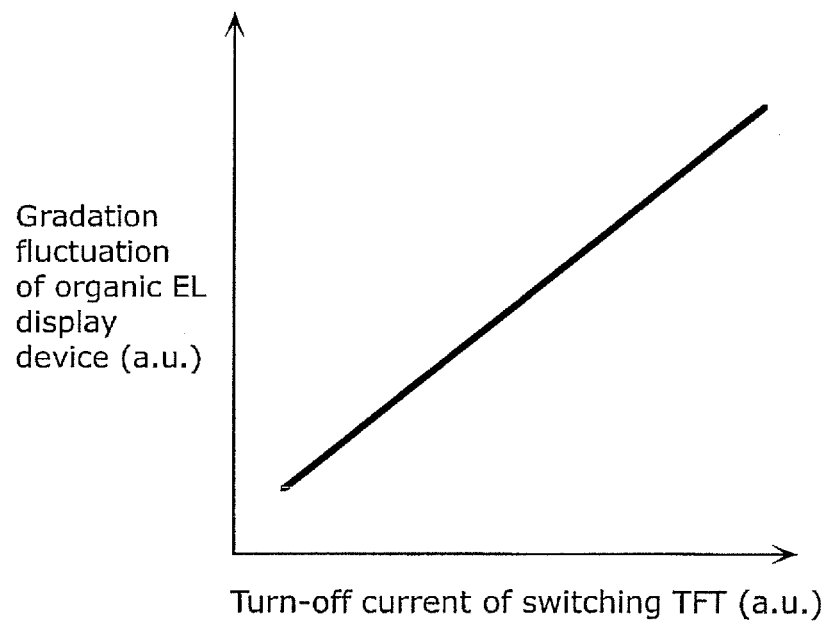
FIG. 17B is a diagram showing a relationship between turn-off current of the switching TFT and gradation fluctuation of an organic EL display device.

Next, the relationship between display performance of the organic EL display device and each of turn-on current of the driving TFT 10a and turn-off current of the switching TFT 10b shall be described with reference to FIGS. 17A and 17B. FIG. 17A is a diagram showing a relationship between turn-on current of the driving TFT and luminance of light emitted by an organic EL display device. FIG. 17B is a diagram showing a relationship between turn-off current of the switching TFT and gradation fluctuation of an organic EL display device.

As shown in FIG. 17A, the luminance of the light emitted by the organic EL display device increases as the turn-on current of the driving TFT 10a increases. In addition, as shown in FIG. 17B, the gradation fluctuation in the organic EL display device decreases, as the turn-off current of the switching TFT 10b decreases. Such decrease in gradation fluctuation is caused by the decrease in the fluctuation of the gate voltage of the driving TFT 10a, which is caused by the decrease in the turn-off current of the switching TFT 10b.

Thus, the organic EL display device 300 including the thin-film transistor array device 100 according to the present embodiment allows, as described earlier, increasing the turn-on current of the driving TFT 10a, thus allowing increasing luminance of the light emitted by the organic EL display device 300. In addition, since it is possible to reduce the turn-off current of the switching TFT 10b, it is possible to reduce gradation fluctuation in the organic EL display device 300. With this, it is possible to obtain the organic EL display device 300 which can display a high-quality image.

(Variation)

In the embodiment described above, the laser irradiation is performed using a long-axis Gaussian CW laser beam having the beam profile illustrated in FIG. 6. However, the laser beam profile is not limited to this example. The beam profile pattern of the long-axis Gaussian CW laser beam may be desirably set with reference to FIGS. 5A and 5B, depending on the crystalline structure to be formed. The following shall describe other beam profile patterns of the long-axis Gaussian CW laser beam with reference to FIGS. 18 to 21.

Note that, in the following variation, the CW laser beam crystallization device used in the embodiment described above may be used. To put it differently, the beam profile may be changed using the CW laser beam crystallization device illustrated in FIG. 1. In addition, the following variation is identical to the embodiment except for the crystalline structures of the first crystalline semiconductor film 5a and the second crystalline semiconductor film 5b. In addition, the beam scanning method of the laser may be performed in the same manner as the embodiment described above.

(Variation 1)

Figure 18:
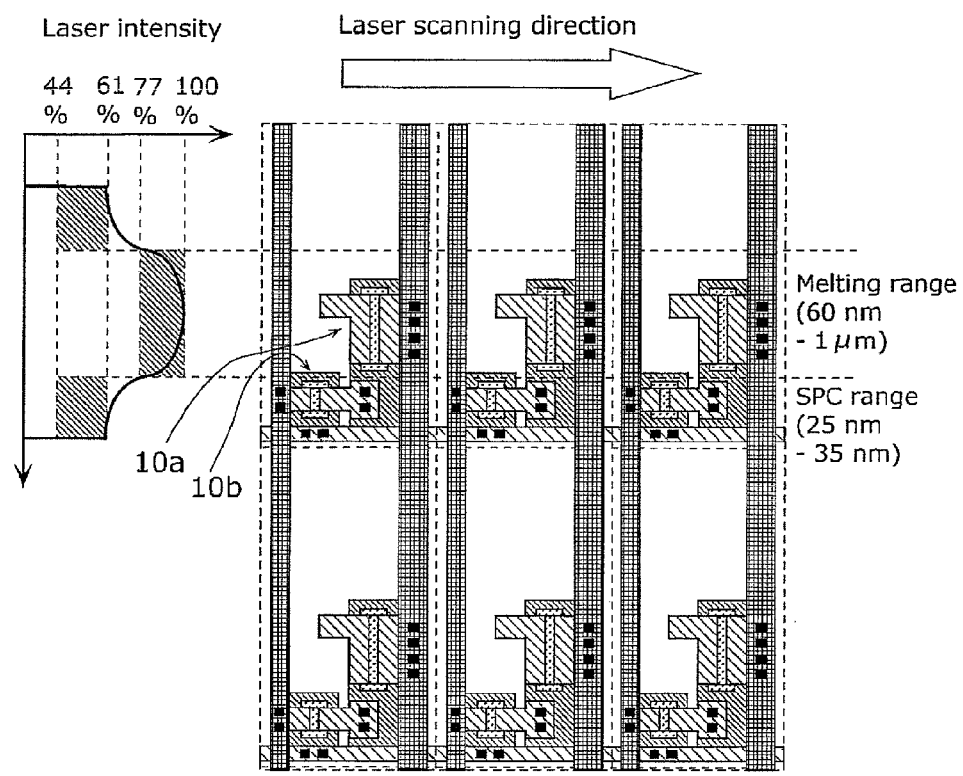
FIG. 18 is a diagram showing a beam profile and a laser irradiation position in the method of manufacturing the thin-film transistor array device according to the variation 1 of the embodiment of the present disclosure.

FIG. 18 is a diagram showing a beam profile and a laser irradiation position in the method of manufacturing the thin-film transistor array device according to the variation 1 of the embodiment of the present disclosure.

As illustrated in FIG. 18, in this variation, the beam profile of the long-axis Gaussian CW laser beam is set such that the channel layer of the driving TFT 10a is the first crystalline semiconductor film 5a formed by crystallizing the noncrystalline semiconductor film in the melting range, and the channel layer of the switching TFT 10b is the second crystalline semiconductor film 5b formed by crystallizing the noncrystalline semiconductor film in the SPC range.

This variation relates to a case in which a crystalline structure crystallized in the melting range and a crystalline structure crystallized in the SPC range are simultaneously formed. As illustrated in FIG. 18, when the maximum light intensity in the light intensity distribution of the long-axis Gaussian CW laser is 100%, the inner region $W_{IN}$ of the light intensity distribution having a constant width is set to have light intensity from 77% to 100%, while the outer region $W_{OUT}$ of the light intensity distribution is set to have light intensity from 44% to 61%.

In this case, the output energy density of the CW laser beam is as follows, as illustrated in FIG. 5A, when the maximum value of the energy density in the light intensity distribution is 9.6 [J/cm$^2$]: the energy density of the inner region $W_{IN}$ in the light intensity distribution (laser beam inner region) may be in a range from 7.4 [J/cm$^2$] to 9.6 [J/cm$^2$], and the energy density in the outer region $W_{OUT}$ in the light intensity distribution may be set in a range from 4.3 [J/cm$^2$] to 5.8 [J/cm$^2$].

Note that, after converting the energy density into the absorption energy of silicon per unit volume, as illustrated in FIG. 5B, when the maximum value of the absorption energy per unit volume in the light intensity distribution is 5.3×10$^5$ [J/cm$^3$], the absorption energy per unit volume in the inner region $W_{IN}$ of the light intensity distribution may be set in a range from 4.1×10$^5$ [J/cm$^3$] to 5.3×10$^5$ [J/cm$^3$]. The absorption energy per unit volume in the outer region $W_{OUT}$ of the light intensity distribution may be set in a range from 2.4×10$^5$ [J/cm$^3$] to 3.2×10$^5$ [J/cm$^3$].

When the amorphous silicon film is irradiated continuously with the long-axis Gaussian CW laser beam with the output energy density set as described above in the predetermined beam scanning direction, the portion irradiated with the inner region $W_{IN}$ of the constant width in the light intensity distribution of the long-axis Gaussian CW laser beam is heated and melts in a temperature in the melting range (1414° C. or above), is cooled, and crystallized, and thereby a first crystalline semiconductor film is formed. At the same time, the portion irradiated with the outer region $W_{OUT}$ in the light intensity distribution of the long-axis Gaussian CW laser beam is crystallized by the solid-phase growth of crystals in the amorphous silicon film in the SPC range (600° C. to 1100° C.), and the second crystalline semiconductor film is formed.

With this, the first crystalline semiconductor film having the crystalline structure crystallized in the melting range and the second crystalline semiconductor film crystallized in the SPC range may be formed at the same time using a common noncrystalline semiconductor film. Here, the crystal grains of the crystalline silicon film (first crystalline semiconductor film) in the region crystallized in the melting range maintains in-plane uniformity, and the average crystal grain size is 60 nm to 1 μm. The crystal grains of the crystalline silicon film (second crystalline semiconductor film) in the region crystallized in the SPC range maintains in-plane uniformity, and the average crystal grain size is 25 nm to 35 nm.

(Variation 2)

Figure 19:
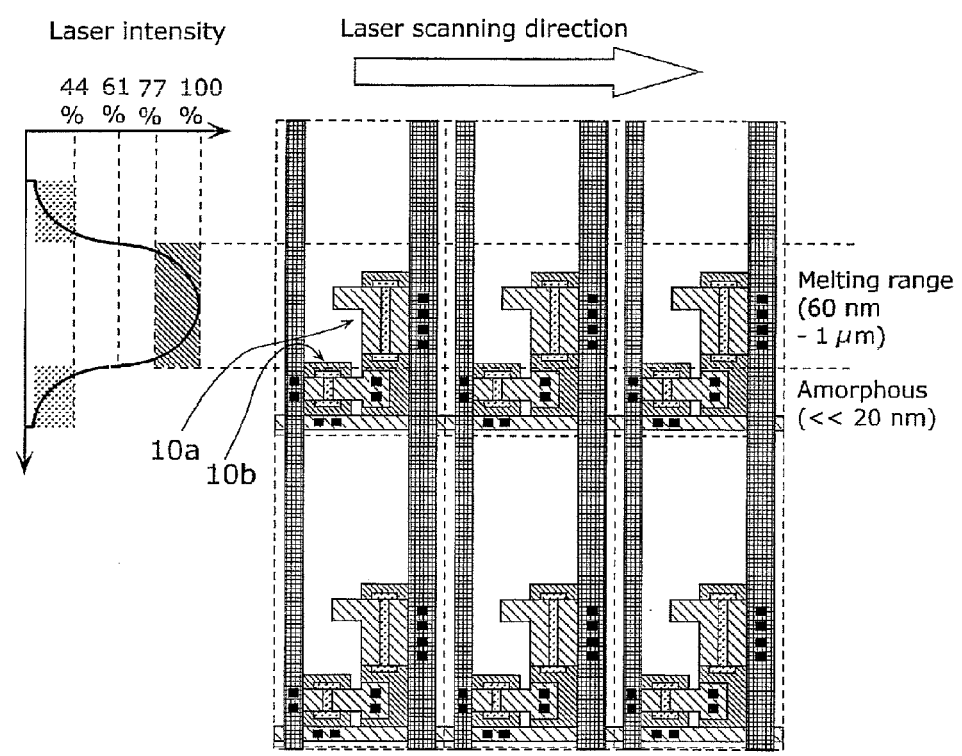
FIG. 19 is a diagram showing a beam profile and a laser irradiation position in the method of manufacturing the thin-film transistor array device according to the variation 2 of the embodiment of the present disclosure.

FIG. 19 is a diagram showing a beam profile and a laser irradiation position in the method of manufacturing the thin-film transistor array device according to the variation 2 of the embodiment of the present disclosure.

As illustrated in FIG. 19, in this variation, the beam profile of the long-axis Gaussian CW laser beam is set such that the channel layer of the driving TFT 10a is the first crystalline semiconductor film 5a formed by crystallizing the noncrystalline semiconductor film in the melting range, and the channel layer of the switching TFT 10b is the noncrystalline semiconductor film irradiated with a temperature range equal to or below the crystal growth temperature of the noncrystalline semiconductor film. More specifically, the channel layer of the switching TFT 10b is not the crystalline semiconductor film (second crystalline semiconductor film 5b) but remains as the noncrystalline semiconductor film.

The variation is directed to a case in which the crystalline structure crystallized in the melting range and the noncrystalline structure are formed at the same time. As illustrated in FIG. 19, when the maximum light intensity in the light intensity distribution of the long-axis Gaussian CW laser is 100%, the inner region $W_{IN}$ having a constant width in the light intensity distribution is set to have light intensity from 77% to 100%, while the outer region $W_{OUT}$ of the light intensity distribution is set to have light intensity from 44% or below.

In this case, the output energy of the CW laser beam is, as illustrated in FIG. 5A, when the maximum value of the energy density in the light intensity distribution is 9.6 [J/cm$^2$], the energy density in the inner region $W_{IN}$ in the light intensity distribution (laser beam inner region) may be in a range from 7.4 [J/cm$^2$] to 9.6 [J/cm$^2$]. With regard to the outer region $W_{OUT}$ in the light intensity distribution, the energy density may be set in a range lower than or equal to 4.3 [J/cm$^2$].

Note that, after converting the energy density into the absorption energy of silicon per unit volume, as illustrated in FIG. 5B, when the maximum value of the absorption energy per unit volume in the light intensity distribution is $5.3 \times 10^5$ [J/cm$^3$], the absorption energy per unit volume in the inner region $W_{IN}$ of the light intensity distribution may be set in a range from $4.1 \times 10^5$ [J/cm$^3$] to $5.3 \times 10^5$ [J/cm$^3$]. The absorption energy per unit volume in the outer region $W_{OUT}$ of the light intensity distribution may be set in a range lower than or equal to $2.4 \times 10^5$ [J/cm$^3$].

When the amorphous silicon film is irradiated continuously with the long-axis Gaussian CW laser beam with the output energy density set as described above in the predetermined beam scanning direction, the portion irradiated with the inner region $W_{IN}$ of the constant width in the light intensity distribution of the long-axis Gaussian CW laser beam is heated and melts in a temperature in the melting range (1414° C. or above), is cooled, and crystallized, and thereby a crystalline semiconductor film is formed. At the same time, the portion irradiated with the outer region $W_{OUT}$ of the light intensity distribution of the long-axis Gaussian CW laser beam is in a temperature range equal to or below the crystal growth temperature of the noncrystalline semiconductor film, and remains amorphous.

With this, using a common noncrystalline semiconductor film, the crystalline semiconductor film having a crystalline structure crystallized in the melting range and an amorphous noncrystalline semiconductor film are formed at the same time. Here, the crystal grains of the crystalline silicon film (first crystalline semiconductor film) in the region crystallized in the melting range maintains in-plane uniformity, and the average crystal grain size is 60 nm to 1 μm. The crystal grains of the noncrystalline semiconductor film irradiated with the laser in a temperature range equal to or below the crystal growth temperature remains in the amorphous state and maintains the in-plane uniformity, and the average crystal grain size is 25 nm or smaller.

(Variation 3)

Figure 20:
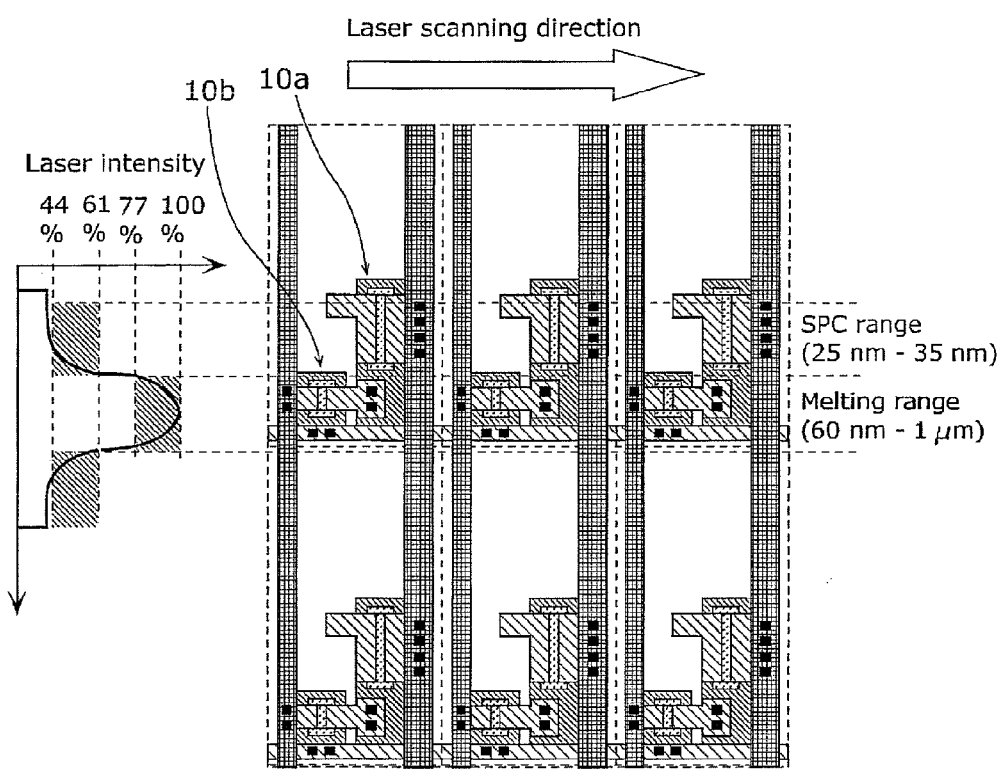
FIG. 20 is a diagram showing a beam profile and a laser irradiation position in the method of manufacturing the thin-film transistor array device according to the variation 3 of the embodiment of the present disclosure.

FIG. 20 is a diagram showing a beam profile and a laser irradiation position in the method of manufacturing the thin-film transistor array device according to the variation 3 of the embodiment of the present disclosure.

As illustrated in FIG. 20, in this variation, the beam profile of the long-axis Gaussian CW laser beam is set such that the channel layer of the driving TFT 10a is the second crystalline semiconductor film 5b formed by crystallizing the noncrystalline semiconductor film in the SPC range, and the channel layer of the switching TFT 10b is the first crystalline semiconductor film 5a formed by crystallizing the noncrystalline semiconductor film in the melting range.

In the configuration of this variation, the crystalline semiconductor films in the channel layers in the driving TFT 10a and the switching TFT 10b are reversed from the variation 1. Accordingly, the beam profile of the long-axis Gaussian CW laser beam is the same in the variation 3 and the variation 1. However, the beam scanning positions of the CW laser beam are different.

More specifically, as illustrated in FIG. 20, the inner region $W_{IN}$ of a constant width in the light-intensity distribution of the CW laser beam is used for forming the second crystalline semiconductor film 5b in the switching TFT 10b, and the outer region $W_{OUT}$ in the light intensity distribution is used for forming the first crystalline semiconductor film 5a in the driving TFT 10a.

(Variation 4)

Figure 21:
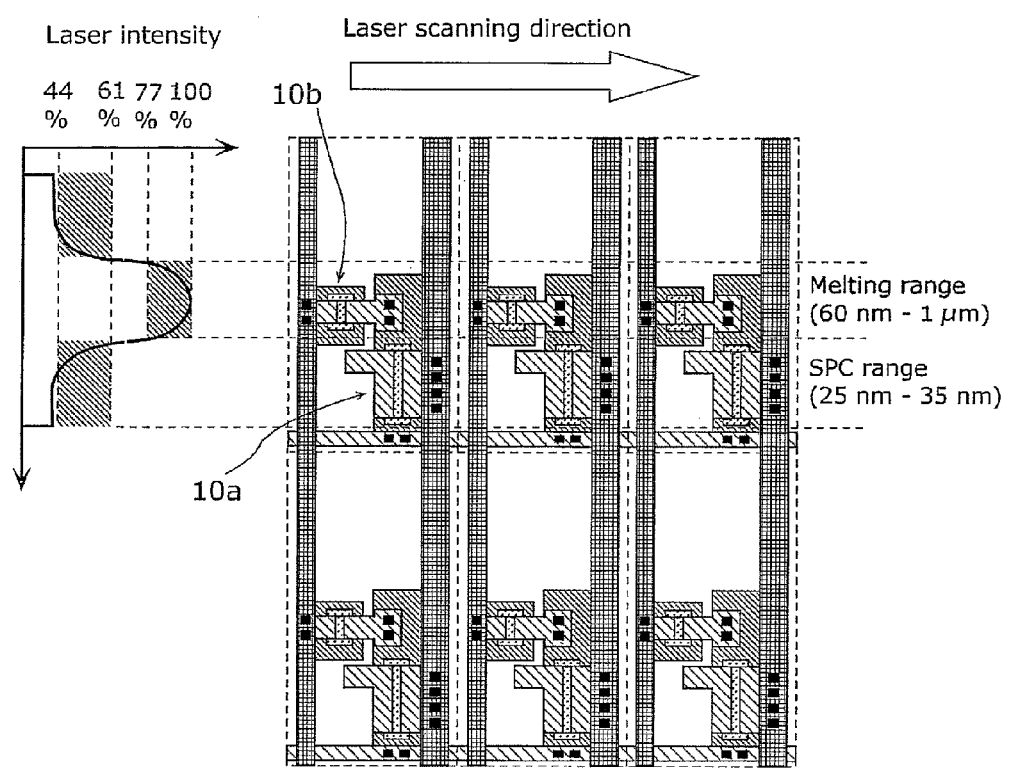
FIG. 21 is a diagram showing a beam profile and a laser irradiation position in the method of manufacturing the thin-film transistor array device according to the variation 4 of the embodiment of the present disclosure.

FIG. 21 is a diagram showing a beam profile and a laser irradiation position in the method of manufacturing the thin-film transistor array device according to the variation 4 of the embodiment of the present disclosure.

As illustrated in FIG. 21, in this variation, the beam profile of the long-axis Gaussian CW laser beam is set such that the channel layer of the driving TFT 10a is the second crystalline semiconductor film 5b formed by crystallizing the noncrystalline semiconductor film in the SPC range, and the channel layer of the switching TFT 10b is the first crystalline semiconductor film 5a formed by crystallizing the noncrystalline semiconductor film in the melting range.

In this variation, the layout of the TFT is different from the variation 1. The beam profile and the beam scanning position of the long-axis Gaussian CW laser beam is the same as the variation 1.

More specifically, as illustrated in FIG. 21, the inner region $W_{IN}$ of a constant width in the light-intensity distribution of the CW laser beam is used for forming the second crystalline semiconductor film 5b in the switching TFT 10b, and the outer region $W_{OUT}$ in the light intensity distribution is used for forming the first crystalline semiconductor film 5a in the driving TFT 10a.

The variations of the present disclosure have been described above. The thin-film transistor array devices according to the variations are applicable to the organic EL display device 300 described above.

Figure 22:
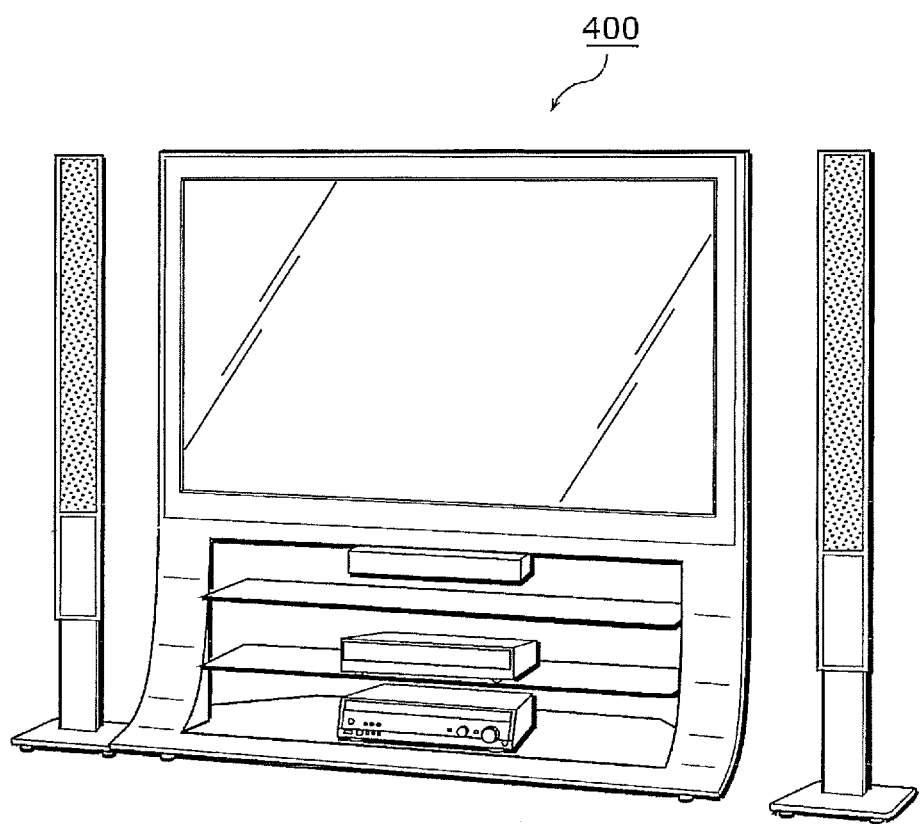
FIG. 22 is an external view of a device including a built-in display panel device according to the embodiment of the present disclosure.

The organic EL display device 300 according to the embodiment and the variations of the present disclosure may be used as a flat-panel display and others. For example, the organic EL display device 300 is applicable to any display device such as the television set 400 illustrated in FIG. 22, a mobile phone, or a personal computer.

Although only some exemplary embodiments of the thin-film transistor array device, the organic EL display device, and the thin-film transistor array device manufacturing method have been described in detail above, the present disclosure is not limited to the embodiment and the variations.

For example, in the embodiment, the first channel layer 50a in the driving TFT 10a and the second channel layer 50b in the switching TFT 10b are both a two-layered structure of a crystalline semiconductor film and the noncrystalline semiconductor film. However, the configuration is not limited to this example. For example, the first channel layer 50a and the second channel layer 50b may be a single-layered structure of a semiconductor film having a predetermined crystalline structure.

Those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The thin-film transistor array device and the organic EL display device according to the present disclosure are widely applicable to electronic devices such as display devices for a television set, a personal computer, and a mobile phone.

The invention claimed is:

1. A thin-film transistor array device manufacturing method, comprising:
 preparing a substrate;
 forming a first gate electrode above the substrate;
 forming a second gate electrode above the substrate and adjacent to the first gate electrode;
 forming a gate insulating film on the first gate electrode and the second gate electrode;

forming, on the gate insulating film, a noncrystalline semiconductor film at least in a first region above the first gate electrode and a second region above the second gate electrode;

irradiating the noncrystalline semiconductor film formed in the first region and the second region with a laser beam having continuous convex light intensity distributions in both a short-axis direction and a long-axis direction; and forming a first source electrode and a first drain electrode above the first region, and a second source electrode and a second drain electrode above the second region, wherein, in the irradiating, the first region and the second region are scanned with the laser beam in one direction in one scanning, an inner region of the laser beam passing through the first region, an outer region of the laser beam passing through the second region, the outer region of the laser beam being outside of the inner region and continuous from the inner region, a light intensity of the outer region being lower than a light intensity of the inner region, wherein the first region and the second region are offset in a direction perpendicular to the one direction.

2. The thin-film transistor array device manufacturing method according to claim 1, wherein, when irradiating the noncrystalline semiconductor film with the laser beam, the first region is irradiated with the inner region of the laser beam such that the noncrystalline semiconductor film in the first region is heated to a first temperature that is at least equal to a melting point of the first crystalline semiconductor film obtained by crystallizing the noncrystalline semiconductor film, and the second region is irradiated with the outer region of the laser beam such that the noncrystalline semiconductor film in the second region is heated to a second temperature that is below the melting point of the first crystalline semiconductor film.

3. The thin-film transistor array device manufacturing method according to claim 2, wherein, when irradiating the noncrystalline semiconductor film with the laser beam, the second region is irradiated with the outer region of the laser beam such that the second temperature is at least equal to the melting point of the noncrystalline semiconductor film.

4. The thin-film transistor array device manufacturing method according to claim 2, wherein, when irradiating the noncrystalline semiconductor film with the laser beam, the second region is irradiated with the outer region of the laser beam such that the second temperature is below a melting point of the noncrystalline semiconductor film and at least equal to a crystal growth temperature of the noncrystalline semiconductor film.

5. The thin-film transistor array device manufacturing method according to claim 2, wherein, when irradiating the noncrystalline semiconductor film with the laser beam, the second region is irradiated with the outer region of the laser beam such that the second temperature is at most equal to a crystal growth temperature of the noncrystalline semiconductor film.

6. The thin-film transistor array device manufacturing method according to claim 2, wherein the irradiating includes crystallizing the noncrystalline semiconductor film by cooling the noncrystalline semiconductor film in the first region after heating the noncrystalline semiconductor film.

7. The thin-film transistor array device manufacturing method according to claim 1, wherein, when irradiating the noncrystalline semiconductor film with the laser beam, the noncrystalline semiconductor film formed in the first region is crystallized into the first crystalline semiconductor film having crystal grains of a first average crystal grain size, and the noncrystalline semiconductor film formed in the second region is crystallized into the second crystalline semiconductor film having crystal grains of a second average crystal grain size smaller than the first average crystal grain size.

8. The thin-film transistor array device manufacturing method according to claim 1, wherein, when maximum light intensity in at least one of the light intensity distributions of the laser beam is 100%, the inner region has a light intensity from 77% to 100%.

9. The thin-film transistor array device manufacturing method according to claim 7, wherein the first average crystal grain size is from 60 nm to 1 μm.

10. The thin-film transistor array device manufacturing method according to claim 1, wherein, when maximum light intensity in at least one of the light intensity distributions of the laser beam is 100%, the outer region has a light intensity from 61% to 77%.

11. The thin-film transistor array device manufacturing method according to claim 3, wherein, when irradiating the noncrystalline semiconductor film with the laser beam, the noncrystalline semiconductor film formed in the second region is crystallized into the second crystalline semiconductor film having an average crystal grain size from 40 nm to 60 nm.

12. The thin-film transistor array device manufacturing method according to claim 3, wherein, when irradiating the noncrystalline semiconductor film with the laser beam, the second region is irradiated with the outer region of the laser beam such that the noncrystalline semiconductor film in the second region is heated to a temperature at least equal to 1100° C. and below 1414° C., and the noncrystalline semiconductor film in the second region is crystallized after a supercooled liquid state.

13. The thin-film transistor array device manufacturing method according to claim 1, wherein, when maximum light intensity in at least one of the light intensity distributions of the laser beam is 100%, the outer region is a region of light intensity from 44% to 61%.

14. The thin-film transistor array device manufacturing method according to claim 4, wherein, when irradiating the noncrystalline semiconductor film with the laser beam, the noncrystalline semiconductor film formed in the second region is crystallized into the second crystalline semiconductor film having an average crystal grain size from 25 nm to 35 nm.

15. The thin-film transistor array device manufacturing method according to claim 4,
wherein, when irradiating the noncrystalline semiconductor film with the laser beam,
the second region is irradiated with the outer region of the laser beam such that the second temperature of the noncrystalline semiconductor film in the second region is at least equal to 600° C. and below 1100° C., and crystals grow by solid-phase growth in the noncrystalline semiconductor film in the second region.

16. The thin-film transistor array device manufacturing method according to claim 7,
wherein a boundary portion between the first crystalline semiconductor film and the second crystalline semiconductor film is removed by patterning.

17. The thin-film transistor array device manufacturing method according to claim 1,
wherein the continuous convex light intensity distributions are Gaussian distributions.

18. The thin-film transistor array device manufacturing method according to claim 1,
wherein the irradiating is performed on the noncrystalline semiconductor film in an order of microseconds.

19. The thin-film transistor array device manufacturing method according to claim 1,
wherein the laser beam is a continuous wave laser beam.

20. The thin-film transistor array device manufacturing method according to claim 1, wherein a first crystalline semiconductor film is formed in the first region and a second crystalline semiconductor film is formed in the second region, with the first crystalline semiconductor film and the second crystalline semiconductor film having different characteristics.

* * * * *